(12) United States Patent
Rye et al.

(10) Patent No.: US 8,104,488 B2
(45) Date of Patent: Jan. 31, 2012

(54) SINGLE SIDE WORKPIECE PROCESSING

(75) Inventors: Jason A. Rye, Kalispell, MT (US); Kyle M. Hanson, Kalispell, MT (US); Daniel J. Woodruff, Kalispell, MT (US)

(73) Assignee: Applied Materials, Inc., Santa Clara, CA (US)

( * ) Notice: Subject to any disclaimer, the term of this patent is extended or adjusted under 35 U.S.C. 154(b) by 638 days.

(21) Appl. No.: 11/782,159

(22) Filed: Jul. 24, 2007

(65) Prior Publication Data

US 2008/0011334 A1 Jan. 17, 2008

Related U.S. Application Data

(63) Continuation-in-part of application No. 11/678,931, filed on Feb. 26, 2007, which is a continuation-in-part of application No. 11/619,515, filed on Jan. 3, 2007, now abandoned, which is a continuation-in-part of application No. 11/359,969, filed on Feb. 22, 2006.

(51) Int. Cl.
*B08B 3/08* (2006.01)

(52) U.S. Cl. ....... 134/180; 134/181; 134/200; 294/64.2; 294/64.3

(58) Field of Classification Search .................. 134/180, 134/181, 200, 902; 438/689, 694, 758; 294/64.1, 294/64.2, 64.3
See application file for complete search history.

(56) References Cited

U.S. PATENT DOCUMENTS

| | | |
|---|---|---|
| 4,510,176 A | 4/1985 | Cuthbert et al. |
| 5,032,217 A | 7/1991 | Tanaka |
| 5,591,262 A | 1/1997 | Sago et al. |
| 5,762,708 A | 6/1998 | Motoda et al. |
| 5,762,751 A | 6/1998 | Bleck et al. |
| 5,815,762 A | 9/1998 | Sakai et al. |
| 6,027,602 A | 2/2000 | Hung et al. |
| 6,056,825 A | 5/2000 | Sumnitsch |
| 6,095,582 A | 8/2000 | Siniaguine et al. |
| 6,099,056 A | 8/2000 | Siniaguine et al. |
| 6,149,759 A | 11/2000 | Guggenberger |
| 6,152,507 A | 11/2000 | Pirker |

(Continued)

FOREIGN PATENT DOCUMENTS

JP 2003017464 1/2003

OTHER PUBLICATIONS

Written Opinion mailed by the Australia Patent Office on Sep. 22, 2008 in Singapore patent application No. SG 200806207-7.

(Continued)

*Primary Examiner* — Michael Barr
*Assistant Examiner* — Benjamin Osterhout
(74) *Attorney, Agent, or Firm* — Kenneth H. Ohriner; Perkins Coie LLP

(57) ABSTRACT

A centrifugal workpiece processor for processing semiconductor wafers and similar workpieces includes a head which holds and spins the workpiece. The head includes a rotor having a gas system. Gas or air is sprayed or jetted from inlets in the rotor to create a rotational gas flow. The rotational gas flow causes pressure conditions which hold the edges of a first side of the workpiece against an angled annular surface on the rotor. The rotor and the workpiece rotate together. Guide pins adjacent to a perimeter may help to align the workpiece with the rotor. Outlets through the rotor allow gas to flow out of the rotor.

12 Claims, 24 Drawing Sheets

U.S. PATENT DOCUMENTS

| | | | |
|---|---|---|---|
| 6,168,697 B1 | 1/2001 | Siniaguine et al. | |
| 6,193,798 B1 | 2/2001 | Sumnitsch | |
| 6,203,661 B1 | 3/2001 | Siniaguine et al. | |
| 6,251,692 B1 | 6/2001 | Hanson | |
| 6,328,846 B1 | 12/2001 | Langen et al. | |
| 6,402,843 B1 | 6/2002 | Siniaguine et al. | |
| 6,423,642 B1 | 7/2002 | Peace et al. | |
| 6,435,200 B1 | 8/2002 | Langen | |
| 6,492,284 B2 | 12/2002 | Peace et al. | |
| 6,494,221 B1 | 12/2002 | Sellmer et al. | |
| 6,536,454 B2 | 3/2003 | Lindner | |
| 6,548,411 B2 | 4/2003 | Wirth et al. | |
| 6,667,242 B2 | 12/2003 | Siniaguine et al. | |
| 6,672,318 B1 | 1/2004 | Tsuchiya et al. | |
| 6,680,253 B2 * | 1/2004 | Wirth et al. | 438/694 |
| 6,848,194 B2 | 2/2005 | Treur | |
| 6,858,092 B2 | 2/2005 | Langen | |
| 6,863,772 B2 | 3/2005 | Cheng et al. | |
| 6,930,046 B2 | 8/2005 | Hanson et al. | |
| 6,969,682 B2 | 11/2005 | Hanson et al. | |
| 7,007,702 B2 | 3/2006 | Langen | |
| 7,066,787 B2 | 6/2006 | Nakanishi et al. | |
| 7,217,325 B2 | 5/2007 | Hanson | |
| 7,229,522 B2 | 6/2007 | Toshima et al. | |
| 7,267,749 B2 | 9/2007 | Wilson et al. | |
| 7,279,116 B2 | 10/2007 | Sax | |
| 2002/0002991 A1 | 1/2002 | Lindner | |
| 2002/0050244 A1 | 5/2002 | Engesser | |
| 2002/0055267 A1 * | 5/2002 | Siniaguine et al. | 438/758 |
| 2002/0108851 A1 * | 8/2002 | Woodruff et al. | 204/242 |
| 2004/0020427 A1 | 2/2004 | Langen | |
| 2004/0023494 A1 * | 2/2004 | Aegerter et al. | 438/689 |
| 2004/0094186 A1 | 5/2004 | Ivanov | |
| 2004/0140536 A1 | 7/2004 | Hidaka et al. | |
| 2004/0241998 A1 * | 12/2004 | Hanson | 438/689 |
| 2006/0154066 A1 | 7/2006 | Kita | |
| 2006/0270193 A1 | 11/2006 | Hidaka et al. | |
| 2007/0000527 A1 | 1/2007 | Aegerter et al. | |

OTHER PUBLICATIONS

U.S. Patent and Trademark Office, Combined International Search Report and Written Opinion of the Searching Authority for PCT/US2007/062448, dated Mar. 27, 2008.

Office Action dated Mar. 8, 2010 issued in Taiwan Application No. 096106289.

EPO Communication dated Mar. 5, 2010 in EP application No. 07757232.9-2222.

Non-final Office Action dated Dec. 30, 2009 in U.S. Appl. No. 11/359,969.

Search and Examination Report mailed May 27, 2010 in Singapore Patent Application No. 200806207-7.

Non-final Office Action mailed Jun. 4, 2010 in U.S. Appl. No. 11/678,931.

* cited by examiner

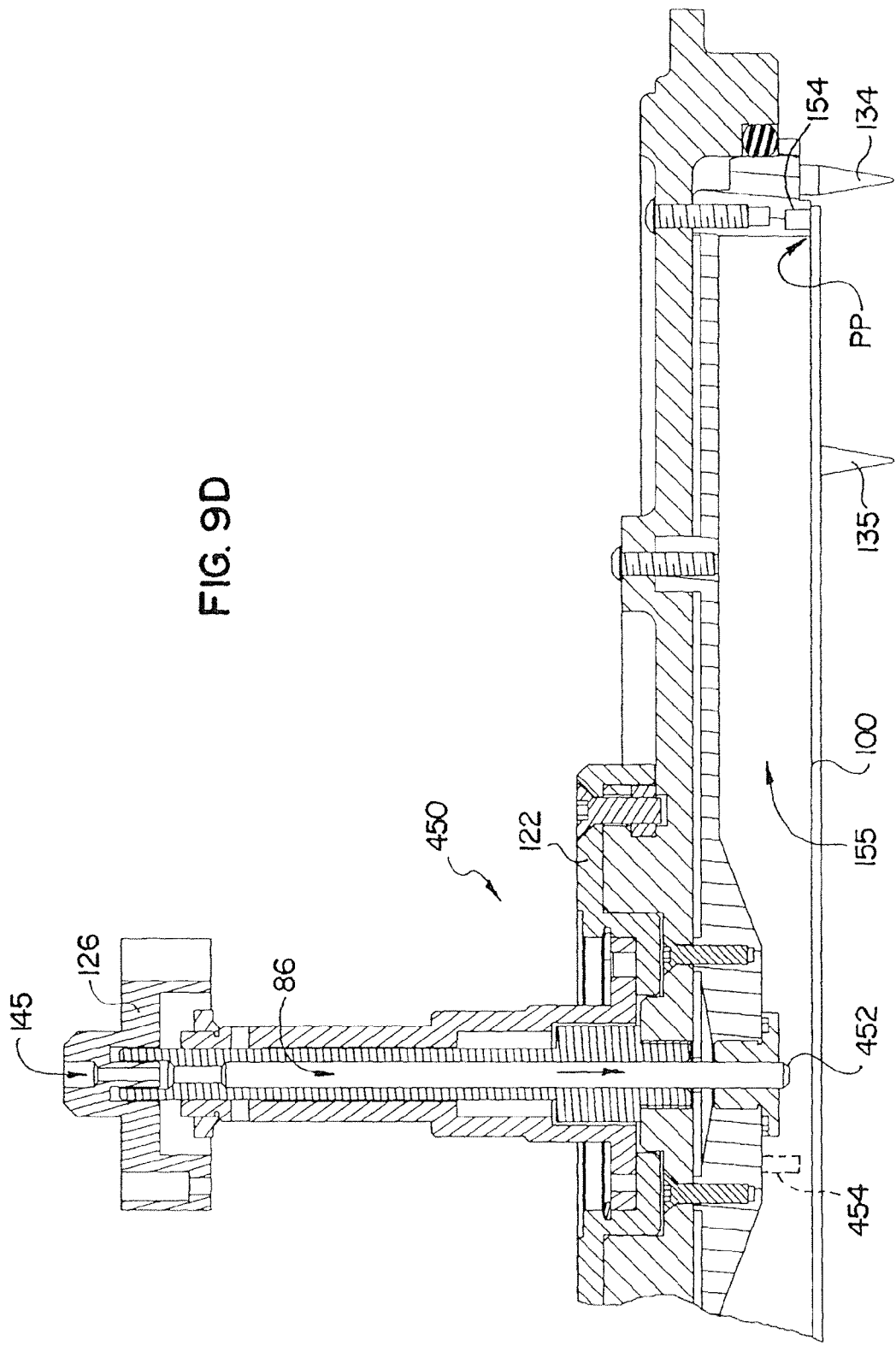

SINGLE SIDE WORKPIECE PROCESSING

This Application is a continuation-in-part of U.S. patent application Ser. No. 11/678,931 filed Feb. 26, 2007, and now pending, which is a continuation-in-part of U.S. patent application Ser. No. 11/619,515, filed Jan. 3, 2007, and now abandoned, which is a continuation-in-part of U.S. patent application Ser. No. 11/359,969, filed Feb. 22, 2006, and now pending. These applications are incorporated herein by reference.

BACKGROUND OF THE INVENTION

Remarkable progress made in microelectronic devices over the past several years has led to more useful yet less expensive electronic products of all types. It has also led to entirely new types of products. A major factor in the development of microelectronic devices has been the machines and methods used to manufacture them. Manufacturing of microelectronic devices requires extreme precision, extremely pure materials, and an extremely clean manufacturing environment. Even microscopic particles can cause defects and failures in devices.

Microelectronic devices are typically manufactured on a front or device side of a semiconductor wafer. In general, no microelectronic devices are on the back side of the wafer. However, contaminants on the back side of the wafer, such as metal particles, residues, films, etc., if not removed, can result in damage to devices on the front side of the wafer. For example, certain metals used in the manufacturing process, such as copper, can migrate through the wafer, from the back side to the front side, where they can cause defects in the microelectronic devices. Processing the backside of the wafer is therefore important.

The back side of the wafer may be processed using existing techniques, to remove contaminants. These techniques involve applying process fluids onto the back side, usually while spinning the wafer. However, the process fluids may damage microelectronic devices if the process fluids contact the front side of the wafer. Therefore, during back side processing, or single side processing in general, the process fluids should ideally make minimal or no contact with the front side or opposite side of the wafer. As the process fluids include liquids, gases or vapors, and as the wafer is usually spinning when they are applied, this objective has largely not yet been reached with current wafer processing technology.

Wafer processing machines have used various designs to try to solve the problem of how to exclude process fluids from the front side while processing the back side. Some of these machines have used flows of inert gas to try to confine the process fluids only to the back side. Others have used gaskets, membranes, or other types of mechanical seals or barriers to keep the process fluids off of the top side of the wafer. However, in the machines using gas flow, some amounts of process fluids tend to still reach the front or device side of the wafer. In the machines using mechanical seals, the seal must physically touch the device side of the wafer. This physical touching may damage microelectronic devices. Consequently, use of seals or physical barriers can have serious disadvantages.

Physical contact with the wafer by seals, fingers, clamps or other sealing, holding or positioning elements, as often used in current processing machines, creates risk of contamination via particle generation or particle release. These types of elements can also disrupt the uniform flow of process fluids on the wafer, resulting in varying degrees of processing at different areas of the wafer. Accordingly, regardless of whether one side or both sides are processed, minimizing physical contact with wafer generally provides better results. On the other hand, the wafer must be properly positioned and secured in place during processing. Accordingly, better machines and methods are needed to provide single side wafer processing, and for processing generally with less physical contact with the wafer.

SUMMARY OF THE INVENTION

New processing machines and methods for solving these difficult wafer back side processing and physical wafer contact problems have now been invented. These machines and methods provide dramatic improvements in manufacturing microelectronic and similar devices. In one aspect of the invention, a circulating gas is provided on one side of the wafer. The circulating gas creates gas pressure and flow conditions that keep process fluids away from the front side, during processing of the back side of the wafer. Accordingly, the back side may be processed using a wide range of process chemicals, without risk of damage to microelectronic devices the front side.

The circulating flow of gas may also hold the wafer in place during processing, via gas pressure forces. The gas flow and pressure conditions created by the circulating gas can exert holding forces at the edges of the wafer, while applying relatively little or no forces towards the unsupported central area of the wafer. The wafer is accordingly held securely in place during processing, with minimal stress applied to the wafer. Physical contact with the wafer during processing of the front side or the back side, or both, is minimized. This reduces potential for contamination and increases wafer yield. As a result, more useable device chips may be produced from each wafer.

A wafer processing machine using circulating gas may have a bowl having one or more process fluid inlets for applying a process fluid onto a first side of a wafer. The machine has a head which can be positioned in engagement with the bowl during workpiece processing. Rotational gas flow is created in a rotor supported on the head. One way of creating the rotational gas flow is by releasing pressurized gas in the rotor in directions at or near tangent to direction of rotation. The rotational gas flow holds the wafer in place on or in the rotor, with minimal physical contact with the wafer. The fluid inlets apply one or more process fluids onto the first side of the wafer, while the wafer rotates with the rotor. In addition to holding the wafer in place, for single side processing, the rotational gas flow in the rotor can also be used to exclude process fluids from the second side of the wafer. In one design, the wafer may be positioned on the rotor with a gap around the edge of the wafer. Some or all of the circulating gas provided into the rotor escapes out through the gap and around the edge of the wafer, or through an outflow path extending through the rotor. This outflow of gas may prevent any of the process fluids applied to the first side from reaching the second side. Alternatively, the rotor may allow for limited or controlled flow of process liquids onto the second side.

In another design, the rotor may have one type of annular edge contact ring that makes contact with or seals against the wafer, near the edge of the wafer. A gas flow path associated with the edge contact ring diverts gas escaping from the rotor away from the edge of the wafer. Process fluid applied to the bottom surface of the wafer wraps around the edge of the wafer and flows only onto a sharply defined edge area on the top surface of the wafer. The rotor may also have another type of annular edge contact ring that contacts the edge of the wafer and prevents virtually any process fluid from moving onto the top surface of the wafer. The invention resides as well in sub-combinations of the machines and methods described.

BRIEF DESCRIPTION OF THE DRAWINGS

In the drawings, the same reference number indicates the same element, throughout the several views. Electrical wiring and gas and liquid plumbing lines are generally omitted from the drawings for clarity of illustration.

FIG. 9D is an enlarged partial section view of yet another alternative rotor.

DETAILED DESCRIPTION OF THE DRAWINGS

The invention is directed to apparatus and methods for processing a workpiece, such as a semiconductor wafer. The term workpiece, wafer, or semiconductor wafer means any flat media or article, including semiconductor wafers and other substrates or wafers, glass, mask, and optical or memory media, MEMS substrates, or any other workpiece having micro-electronic, micro-mechanical, or microelectro-mechanical devices.

Figure 1:
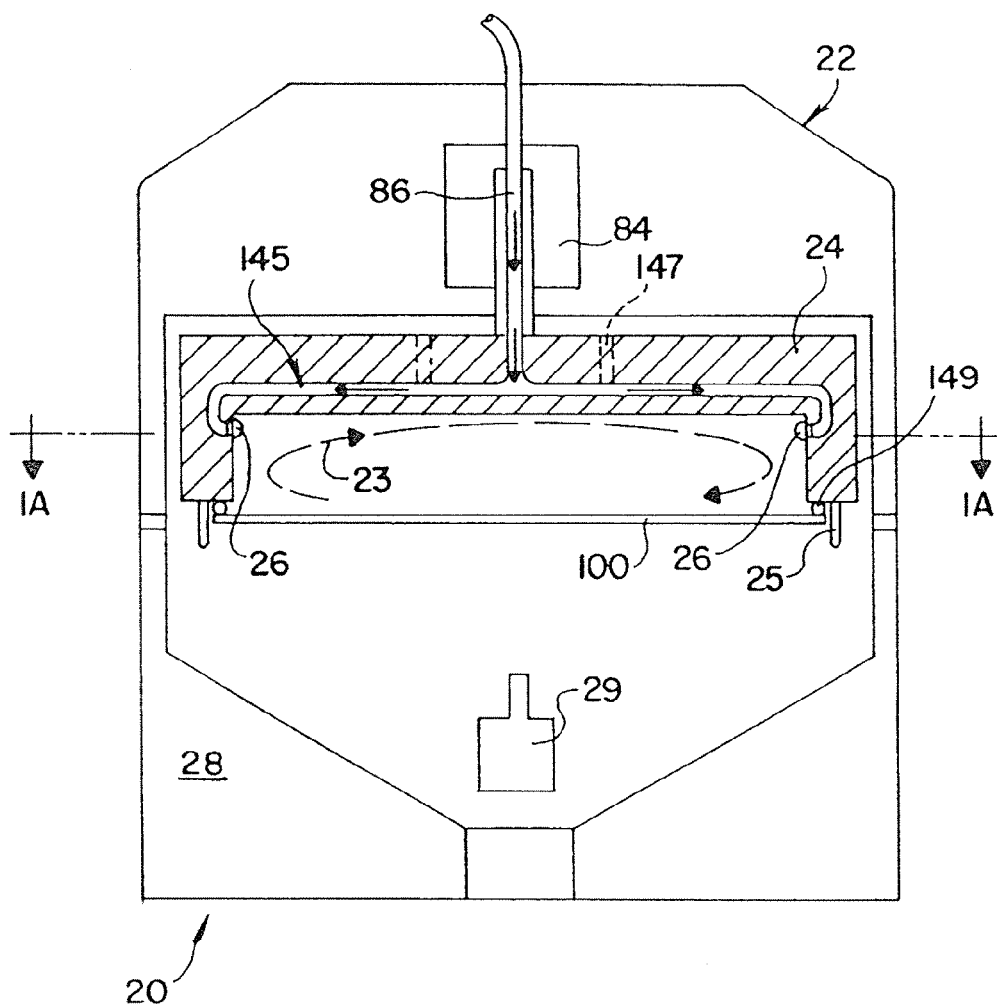
FIG. 1 is a section view showing principles of operation of the invention.

Turning to FIG. 1, a processor 20 may perform single side processing. Single side processing means applying one or more process fluids to only one side (referred to here as the back side) of the wafer, and with the process fluid substantially excluded from contacting the second (front) side of the wafer. The process fluid may optionally also contact the bevel edge of the wafer. The process fluid may be a liquid, a gas or a vapor. In FIG. 1, the processor 20 includes a rotor 24 linked to a spin motor in a head 22. Guide pins 25 may be provided around a perimeter of the rotor 24, to help guide a wafer 100 into position. Gas nozzles or inlets 26 spray or jet out gas in a direction which creates a gas vortex flow in the rotor 24. The arrows 23 in FIGS. 1 and 1A indicate the direction of gas flow. This gas flow creates a negative or lower pressure zone in the space above the wafer 100. As a result, pressure forces may be used hold the wafer 100 onto the rotor 24.

Referring to FIG. 1, the rotor 24 may be designed so that the only escape path for the gas is the annular opening between the edge of the wafer and the rotor. In this design, as the gas escapes or flows out of the rotor 24, the gas substantially prevents the wafer 100 from touching the rotor 24. The wafer is essentially supported on, or held up by, a cushion of moving gas. The guide pins 25 may be provided to minimize or limit any side-to-side movement of the wafer in the rotor 24.

Referring still to FIG. 1, the head 22 may be placed in or moved into alignment or engagement with a base or bowl 28. Process fluids are applied onto the back side of the wafer from one or more nozzles or inlets 29 in the bowl 28. During processing, the motor 84 spins the rotor 24. The wafer 100 spins with the rotor 24. Process fluids are applied to the back side of the wafer. In FIG. 1, the back side is the down facing side. The gas flow escaping from the rotor 24 acts as an isolation barrier for the front side of the wafer. As the gas is constantly flowing outwardly, no process fluid can move into the rotor 24 or contact the top side of the wafer. Consequently, highly effective single side wafer processing may be achieved.

Figure 1A:
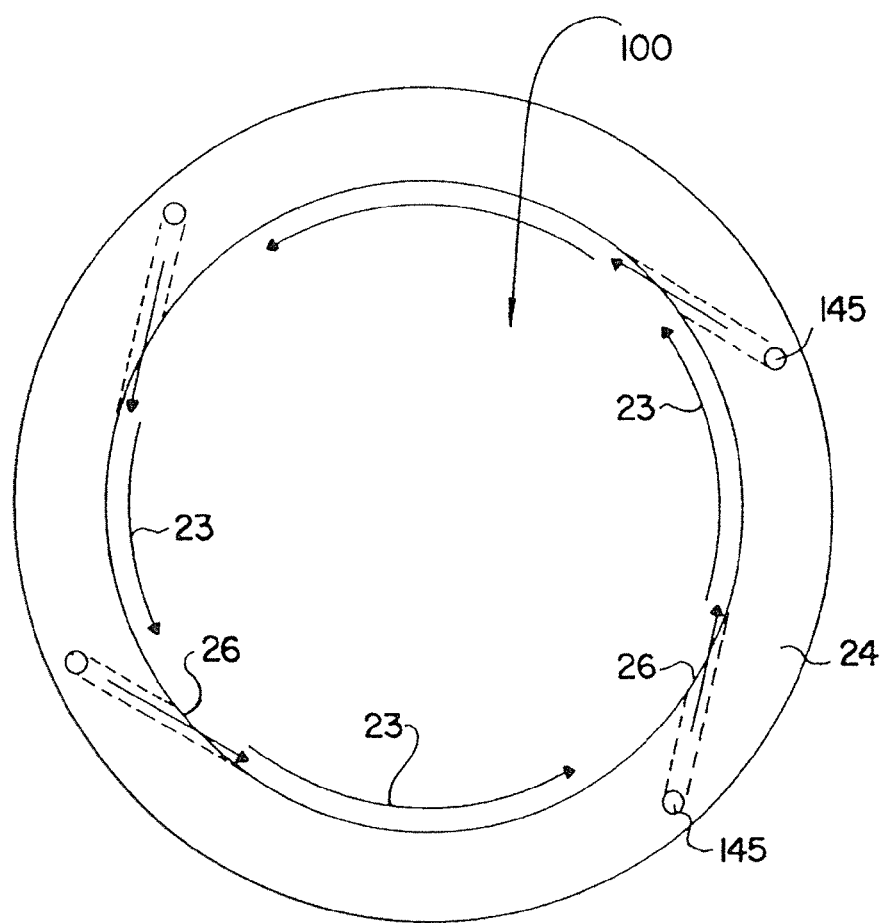
FIG. 1A is a section view taken along line 1A-1A of FIG. 1.

Referring now to FIGS. 1 and 1A, the gas flow is shown by the arrows 23. The rotor is designed to create a rotational gas flow. Near the inlets 26 (adjacent to the perimeter of the rotor), gas flow velocity is relatively high, and gas pressure is correspondingly relatively low. Towards or at the center of the rotor, gas flow velocity is relatively lower, and gas pressure is correspondingly higher. Consequently, pressure forces holding the wafer in place on the rotor are highest near the wafer edges (where the negative gas pressure is highest) and are lowest towards the center. Towards or at the center of the rotor, gas flow velocity may be at or close to zero. Thus gas pressure in the inner area of the rotor will typically be only slightly negative, neutral, or even slightly positive. As a result, the edge areas of the wafer can be securely held against the rotor, with minimum forces acting on the center of the wafer. Bending stresses on the wafer may therefore be reduced.

Figure 1B:
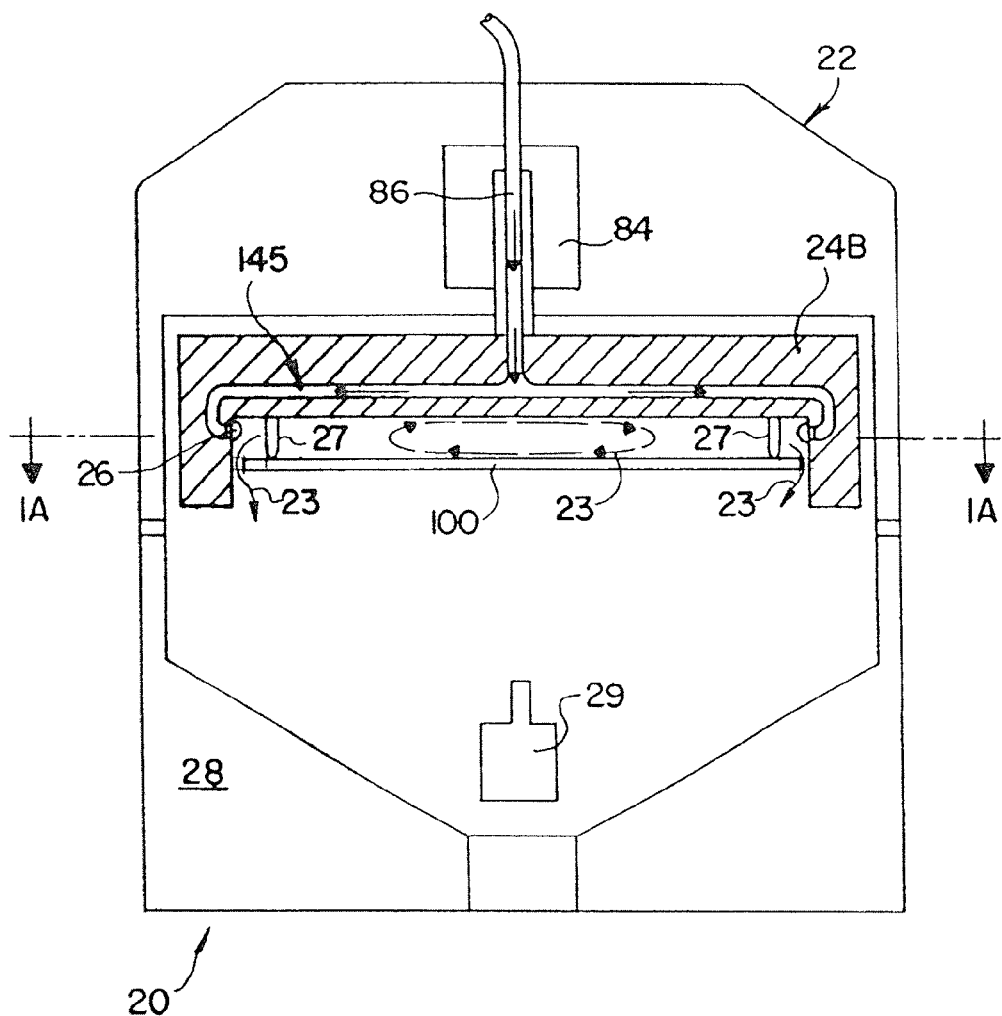
FIG. 1B is a section view of an alternative design.
Figure 2:
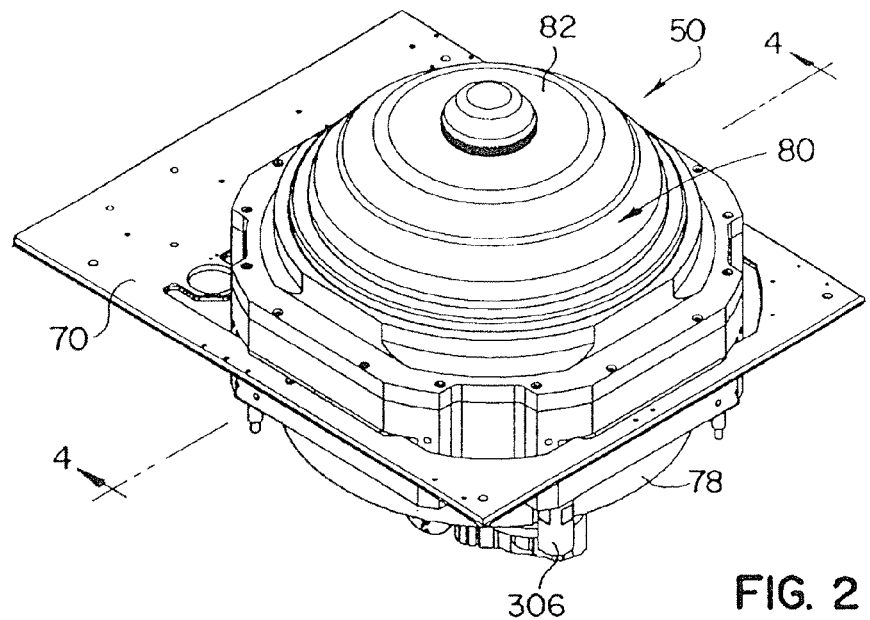
FIG. 2 is a top perspective view of a workpiece processor.

FIG. 1B shows a design where the rotor 24B has a diameter larger than the wafer 100. In this design, the wafer is entirely within the rotor 24B. The rotor 24B operates in the same way as the rotor in FIGS. 1 and 1A. However, the wafer is held away from the face of the rotor 24B by standoffs or pins 27. In this design, guide pins 25 are not needed, as the cylindrical side walls of the rotor prevent the wafer 100 from shifting excessively off center.

In each of the designs described here, the way that the gas escapes from the rotor may vary. In FIG. 1, gas escapes out through the annular opening between the edge of the wafer and the rotor. In the design shown in FIG. 1B, the gas escapes out through the annular gap between the edge of the wafer and the cylindrical side walls of the rotor. However, other gas escape openings may be used, alone or in combination with the opening and gap shown in FIGS. 1 and 1B. For example, gas outlets 147 shown in dotted lines in FIG. 1 may be provided in the rotor. The gas outlets 147 may be holes, slots, or other openings. The gas outlets 147 may be located anywhere on the rotor, and take any form which will facilitate the rotational gas flow described above.

With some processes and wafers, seals making physical contact with the wafer may be used. In these applications, a contact sealing element, such as a seal ring 149 shown in FIG. 1, may also be used to provide a physical seal between the rotor and wafer during processing. The negative pressure or vacuum conditions described above hold the edges of wafer securely against the seal ring 149. Gas outlets 147 in the rotor provide an escape path for the gas flow. The positioning pins 25 can be omitted since the wafer is held in physical contact with the seal ring, largely preventing any shifting of the wafer during processing.

Figure 6:
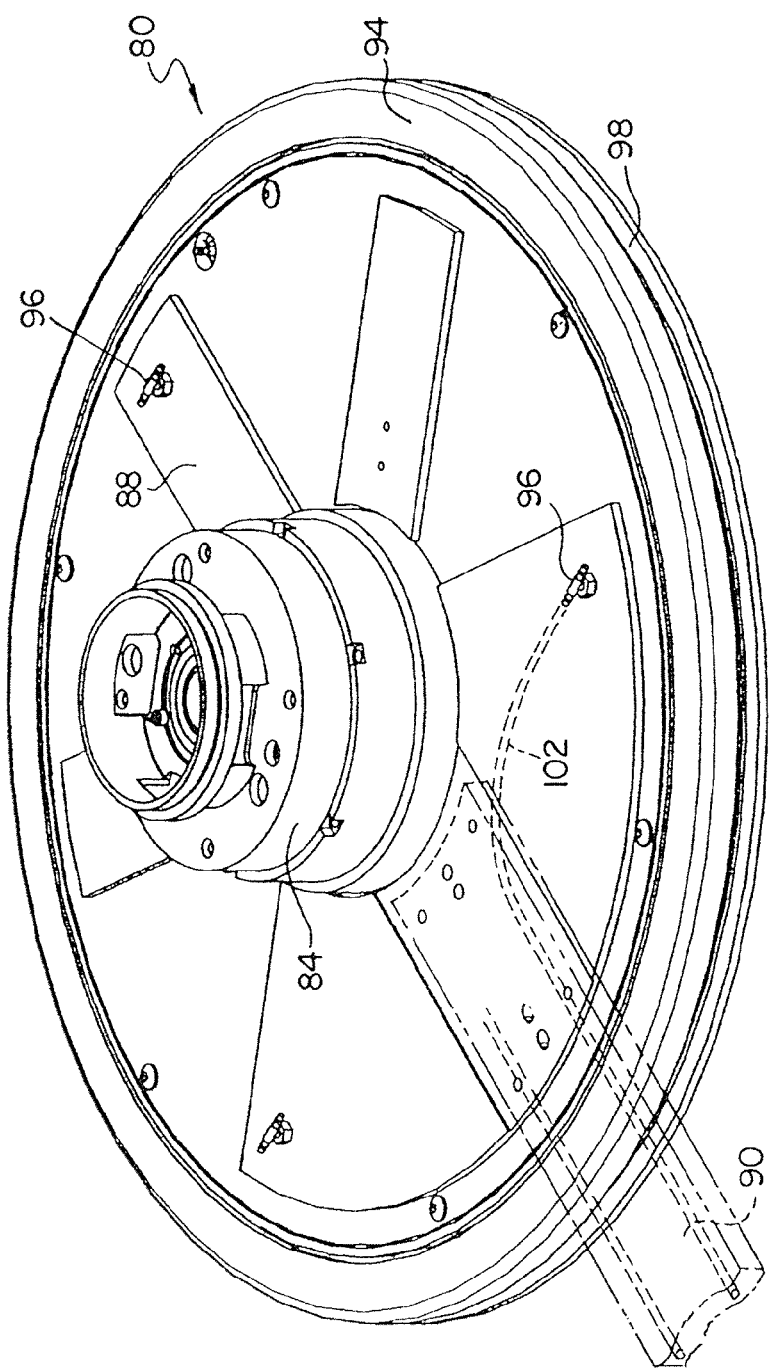
FIG. 6 is a top perspective view of the head shown in FIGS. 2-5, with the cover removed for illustration.
Figure 7:
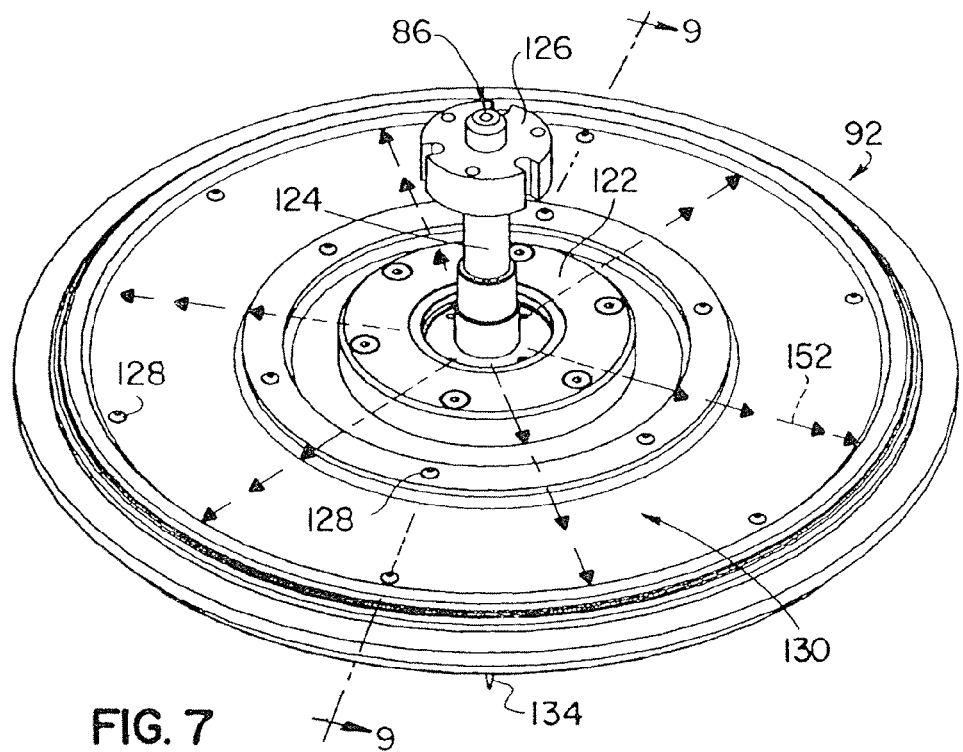
FIG. 7 is a top perspective view of the rotor shown in FIGS. 4 and 5.

FIGS. 2-5 show an example of a processor 50 which may use the principles of operation described above relative to FIG. 1. However, FIGS. 2-5 show various additional elements which are not essential to the invention. As shown in FIGS. 2-5, the processor 50 includes a head 80 and a bowl 78. The bowl 78 may be supported on a mounting plate 70 which in turn may be attached to the deck 52. As shown in FIGS. 6 and 7, a spin motor 84 may be supported on a base plate 88 of the head 80, and covered by a head cover 82. A rotor 92 is typically driven by the spin motor 84 and spins within the head 80. However, the motor 84 can be omitted in favor of other techniques used to spin the rotor.

The head 80 is engageable with the bowl 78. Specifically, for processing, the head 80 may be moved to a position adjacent to (but not contacting) the bowl 78, or the head 80 may be physically contacting with the bowl 78, or even sealed against the bowl 78, as shown in FIG. 4.

Figure 4:
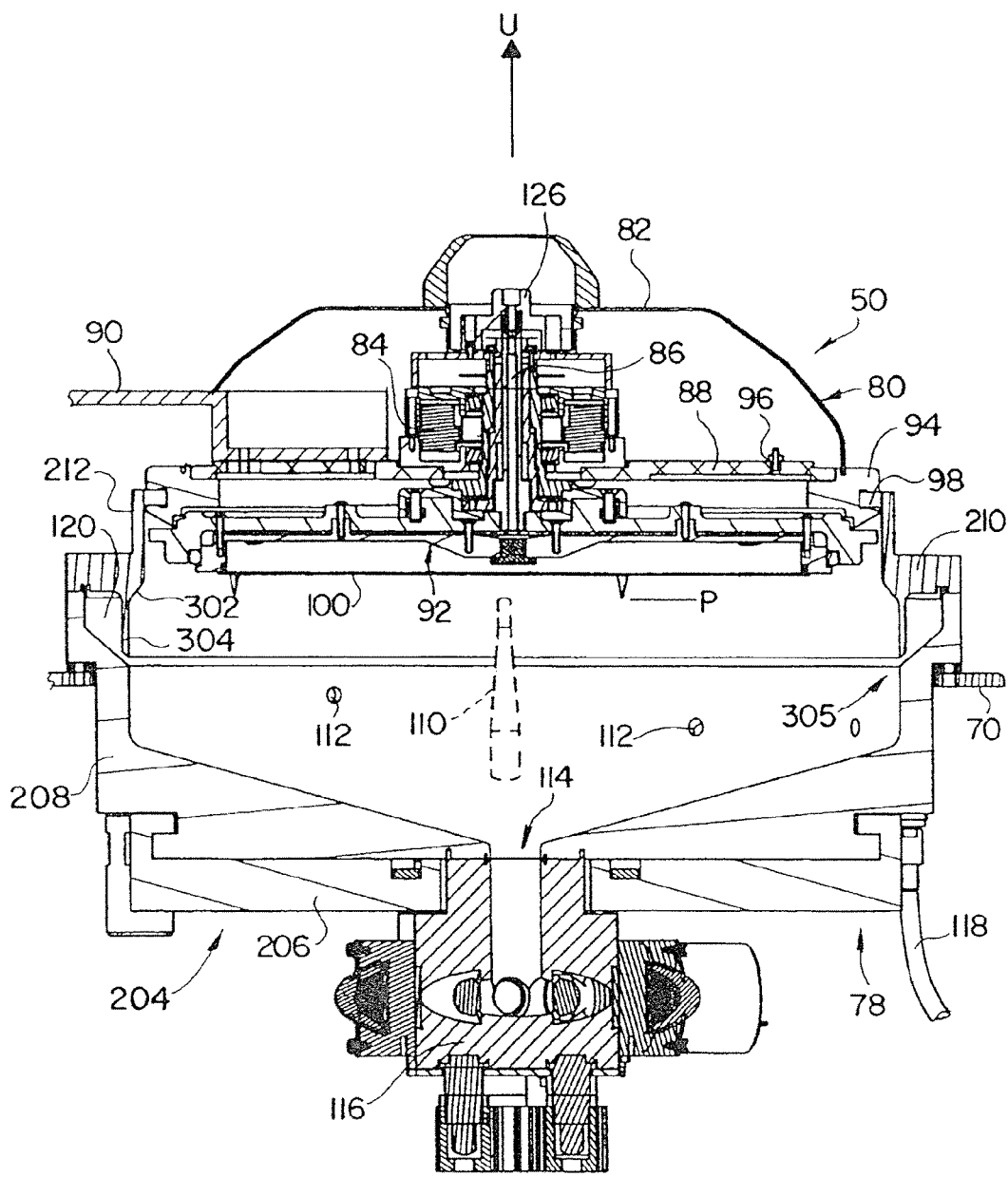
FIG. 4 is a section view taken along line 4-4 of FIG. 2.
Figure 5:
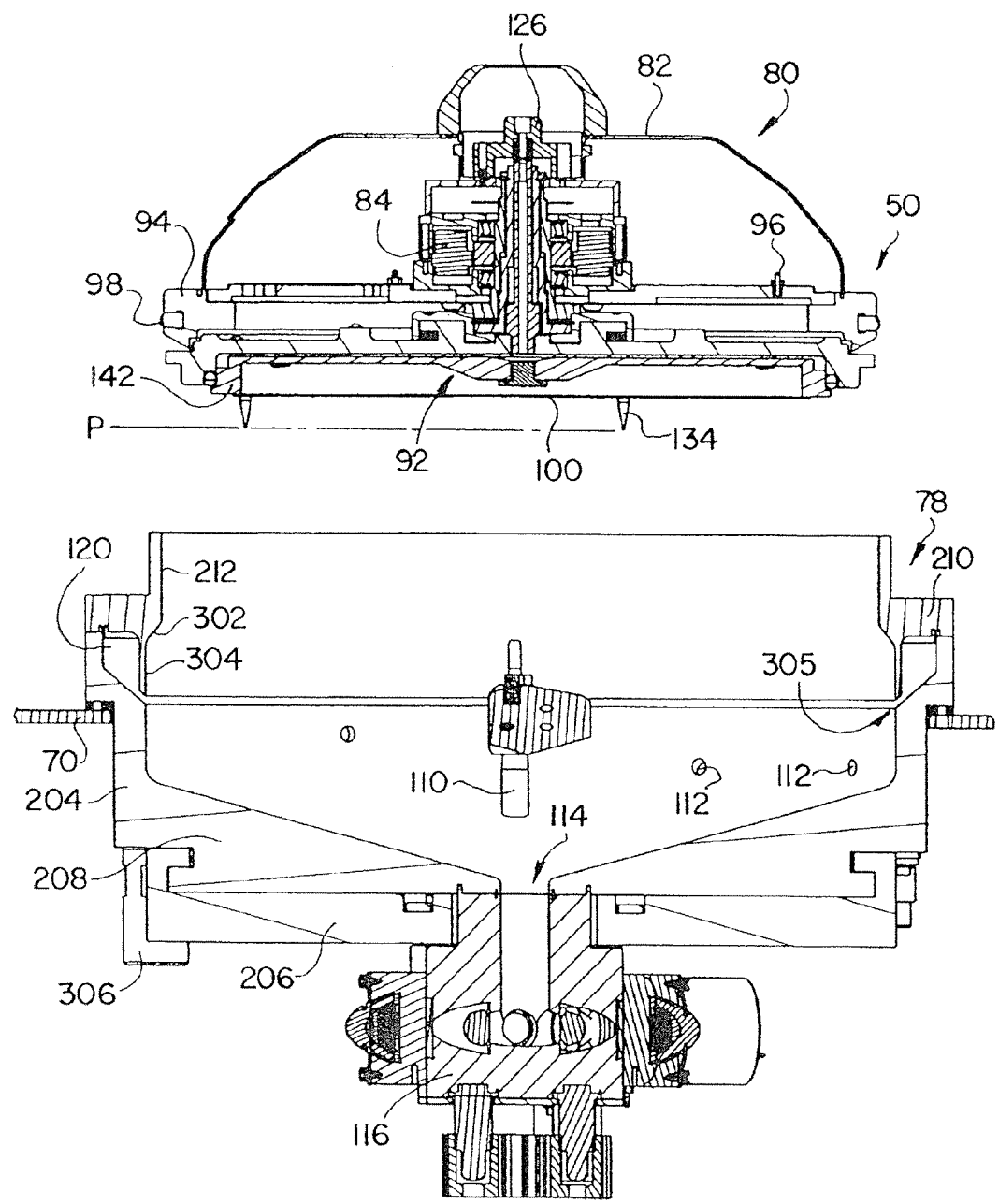
FIG. 5 is a section view of the processor as shown in FIG. 3.

As shown in FIGS. 4 and 5, the bowl 78 has liquid spray nozzles or inlets 112, for applying a process liquid onto the back or down facing surface of a workpiece 100 held in the head 80. The nozzles or inlets 112 may be fixed in position on the sides or bottom surfaces of the bowl 78. Alternatively, some or all of the nozzles 112 may be moving, e.g., on a swing arm. Combinations of fixed and moving nozzles 112 may also be used. Fixed or moving spray manifolds having multiple nozzles or inlets, may also be used in the bowl 78. Gases or vapors may also be applied to the workpiece 100 via the nozzles 112. A drain 114 collects spent process fluid for removal from the bowl 78. One or more valves 116 may be associated with the drain 114. Bowl stand-offs 110, if used, are attached to the bowl and project upwardly from the bowl 78 towards the workpiece 100 on the head 80. As shown in FIG. 5, the head 80 may be lifted vertically away from the bowl 78 by a head lifter (not shown) connected to the head by a head lifting arm 90, shown in FIG. 4.

FIG. 6 shows the head 80 with the cover 82 and other components removed for illustration. Head gas supply lines 102 advantageously deliver gas or clean dry air to gas ports 96 passing through the base plate 88, to provide a flow of gas between the base plate 88 and the rotor 92. This flow of head gas or clean dry air helps to prevent migration of process liquids, vapors, or gases into the head 80, thereby reducing corrosion of head components. A head ring 94 may be attached around the outside of the base plate 88. An inflatable seal 98 may be provided in a groove in the head ring, to seal the head 80 against the bowl 78 during processing. The components shown in FIG. 6 which are part of the head 80, are supported by the head lifting arm 90, and do not rotate.

Figure 8:
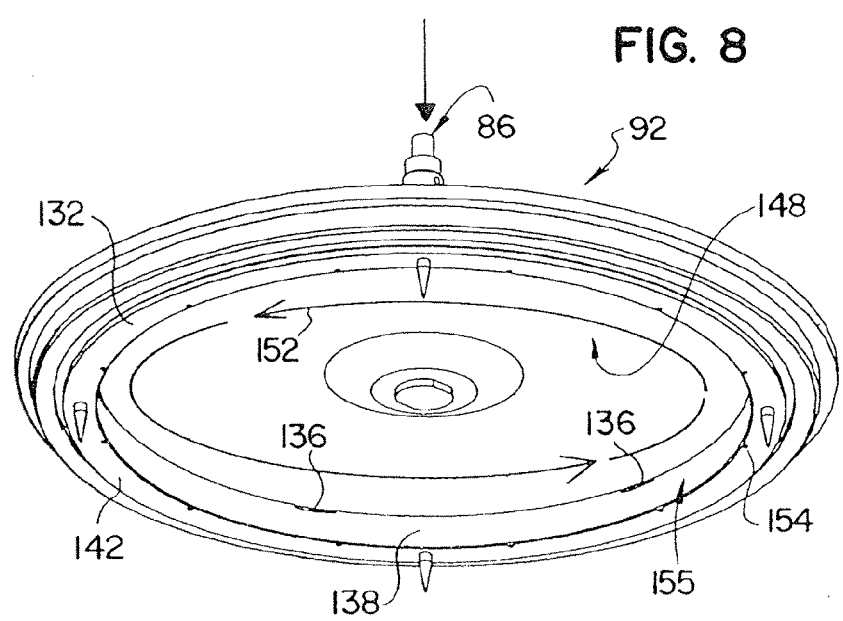
FIG. 8 is a bottom perspective view of the rotor shown in FIG. 7.
Figure 9:
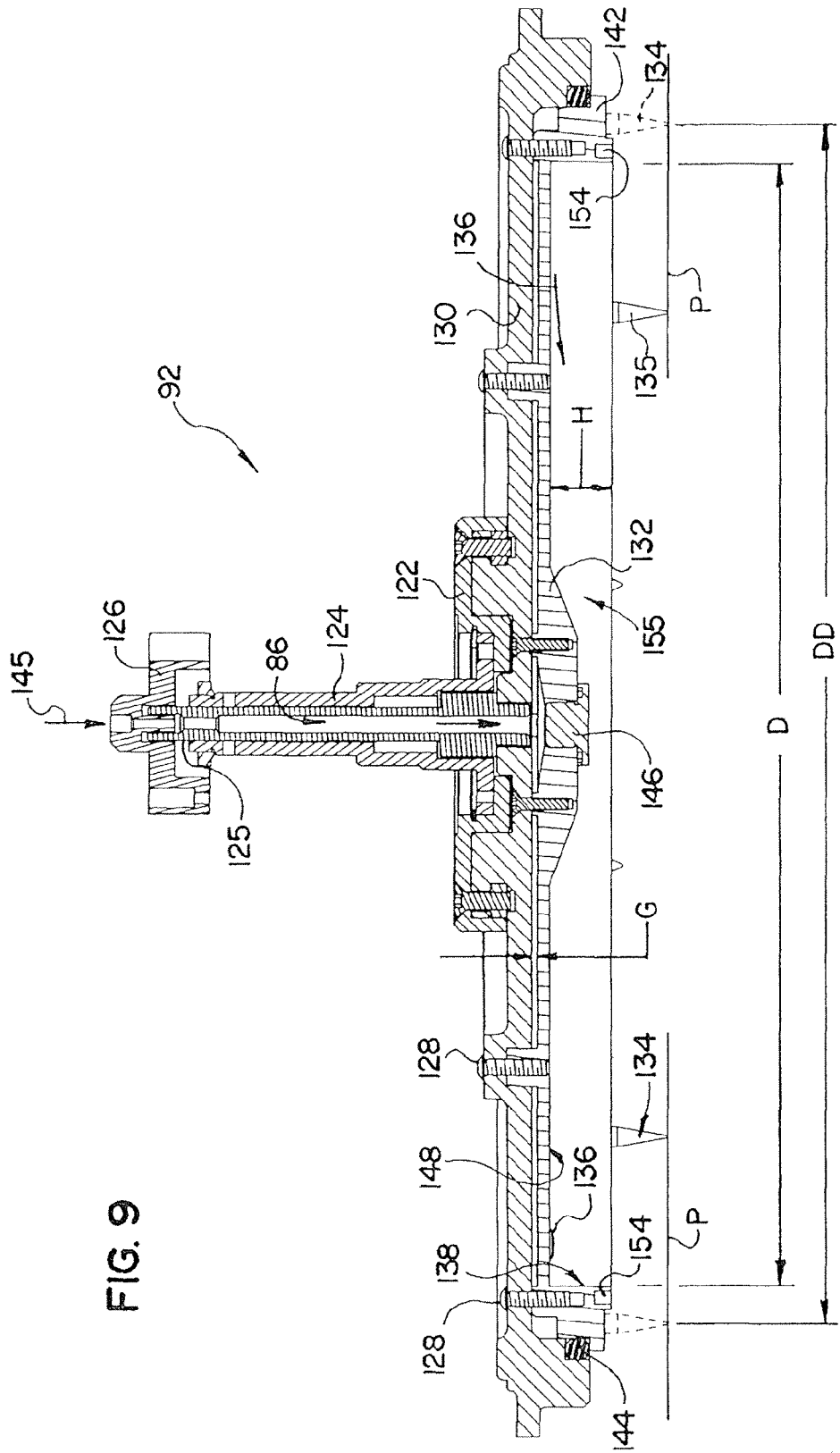
FIG. 9 is a section view taken along line 9-9 of FIG. 7.

Turning now to FIGS. 7, 8 and 9, in the example shown, the rotor 92 has a drive plate 130 attached to a shaft 124 at a hub 122. The shaft 124 is keyed to the spin motor 84 in the head 80. A chuck 132 is attached to the drive plate 130 by screws 128 or other fasteners. As shown in FIGS. 8 and 9, guide pins 134 extend out (or downwardly) from an outer rim 142 of the chuck 132. The guide pins 134 may have a conical or tapered section 135. As shown in FIG. 9, contact pins 154 project slightly from the chuck outer rim 142. The contact pins 154 are shorter than the guide pins 134 and are positioned radially inside of the guide pins 134.

Referring still to FIG. 9, the chuck 132 has a cylindrical side wall 138 joined, typically substantially perpendicularly, to a top or web plate 148. An O-ring or other seal 144, if used, seals the outer surface or perimeter of the chuck 132 against the drive plate 130. The web or top plate section 148 of the chuck 132 is generally spaced apart from the drive plate 130 by a gap G (except at the fastener 128 attachment points).

A supply of gas, such as nitrogen, or clean dry air, under pressure, connects from a supply line in the head 80, through a labyrinth cap 126 (shown in FIGS. 4, 5 and 7) attached to the motor housing and into an inlet line 86 extending through a sleeve 125 within the shaft 124. The sleeve 125 is attached to the drive plate 130 and rotates within the cap 126

Gas provided to the head 80 flows (downwardly in the design shown) through the inlet line 86, as shown in FIG. 9, radially outwardly in the gap G between the chuck 132 and the drive plate 130, as shown in FIGS. 7 and 9, to gas inlets 136. The disk-shaped gap G provides a flow passageway from the inlet line 86 to the gas inlets 136. The gas inlets 136, located in the side wall 138 of the chuck 132 are positioned to jet or spray gas in a direction fully or at least partially tangent to the cylindrical side wall 138. The inlets are oriented so that the gas direction is tangent to the sidewalls, or within 40, 30, 20 or 10 degrees of tangent. Multiple gas inlets 136, for example, 3, 4, 5, 6, 7 or 8 gas inlets 136 are advantageously radially spaced apart and positioned in the side wall 138, close to the top or web 148 of the chuck 132. The number, shape, configuration, and location of the gas inlets 136 may of course be changed, as various designs may be used to create gas flow conditions which will cause the workpiece 100 to be held in place on the rotor 92. The O-ring or seal 144 may be used to prevent gas from escaping from the gap G, except through the gas inlets 136.

The side walls 138 of outer rim 142 on the chuck plate 132 form a space generally designated 155 in the chuck 132 having a diameter D, and a depth or height H, as shown in FIG. 9. The dimension H is substantially uniform, except at the central area around the hub 122.

A central opening may be provided in the chuck plate 132 for alignment purposes. If used, the opening is closed via a plug 146 before the rotor 92 is put into use. Referring now to FIGS. 8 and 9, the guide pins 134 are positioned on a diameter DD slightly larger than the diameter of the workpiece 100

(which in turn is slightly larger than the diameter D of the cylindrical or disk-shaped space 155). Accordingly, with a workpiece placed into the rotor 92, as shown in FIG. 4, there is only nominal radial or lateral clearance between the guide pins 134 and the edge of the workpiece.

Figure 3:
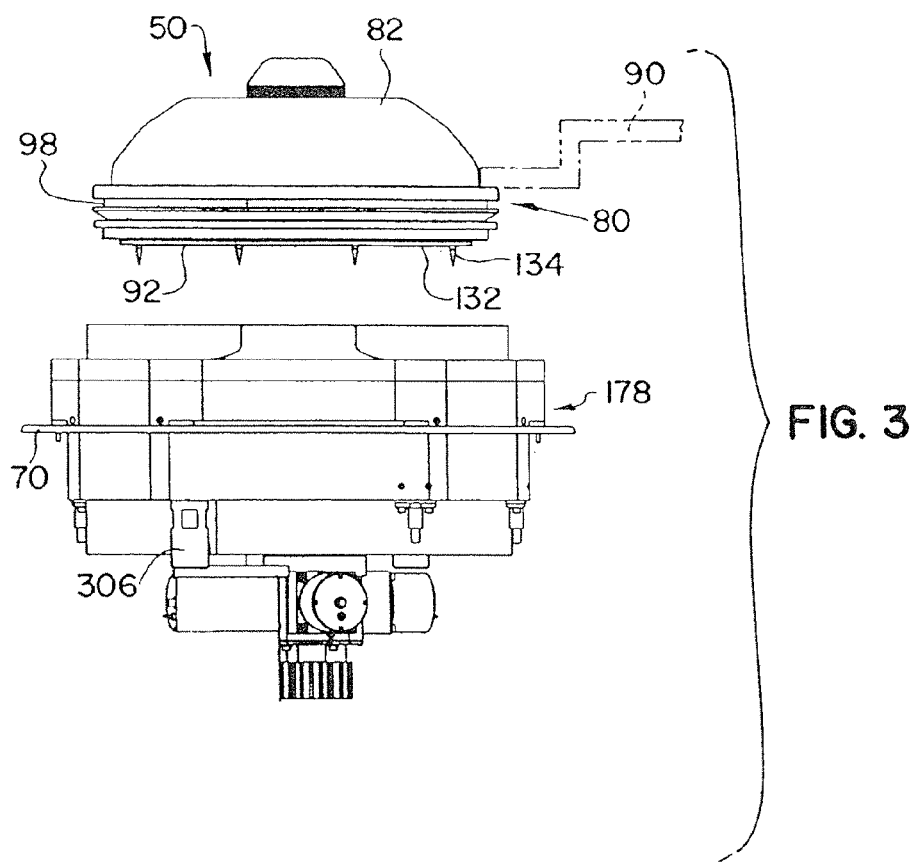
FIG. 3 is a side view of the processor shown in FIG. 2, in an open or load/unload position.
Figure 11:
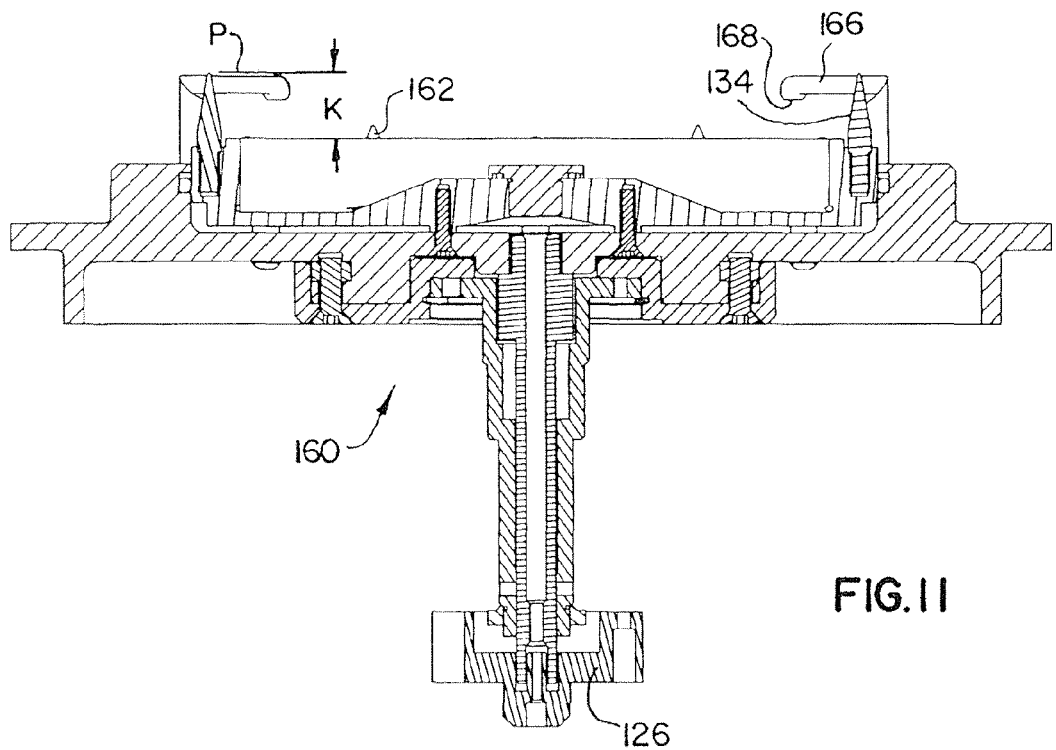
FIG. 11 is a section view taken along line 11-11 of FIG. 10.

Referring to FIG. 3, the processor 50 is in the up or open position for loading and unloading. In the design shown, the head lifting arm 90 lifts the head 82 up from the bowl 78. A workpiece 100 is moved into a position between the head 82 and the bowl 78, with the workpiece 100 generally aligned with the rotor 92. The workpiece is then moved vertically upwardly, with the guide pins 134 around the outside edge of the workpiece. The workpiece at this point is at or above the plane P of the guide pins 134, as shown in FIG. 11. These workpiece loading movements may be performed manually, or by a robot, as further described below.

Gas is then supplied to the rotor 92. Referring momentarily to FIG. 8, due to the generally tangential orientation of the gas inlets 136 and the relatively high velocity of the gas flowing out of the inlets 136, a rotational gas flow or vortex is created within the space 155, between the workpiece and the top plate 148 of the chuck 132. The gas flows in a circular pattern in the space 155. The gas may then move out of the space by flowing around the edge of the workpiece 100 and into the bowl 78. This creates a negative pressure or vacuum at the outer areas of the space 155, causing the workpiece to lift up and off of the robot 44. The negative pressure in the outer areas space 155 above the workpiece 100 holds the top surface of the workpiece against the contact pins 154. This prevents the workpiece from rotating or shifting relative to the rotor 92. The contact pin 154 may have a spherical end which essentially makes point contact with the wafer. Alternatively, the contact pin may have an end that makes contact over a very small area, e.g., over a diameter of 0.2-3 mm.

The normal force acting to hold the workpiece 100 against the contact pins 154 depends on the pressure difference created by the vortex gas flow, and the surface area of the workpiece on which the pressure acts. The normal force may be adjusted by controlling the gas flow. In general, the normal force will significantly exceed the weight of the workpiece, so that the workpiece remains held against the contact pins 154, regardless of its orientation relative to gravity. The contact pins 154 which may be the only surfaces supporting the workpiece, are generally positioned within 2-10, 4-8, or 5-7 mm of the edge of the workpiece.

The head lifter then lowers the head lifting arm 90 and the head 80, with the head moving from the open position shown in FIG. 5, to the closed or processing position shown in FIG. 4. The seal 98, if used, is inflated, creating a partial or full seal between the head 80 and the bowl 78.

The only escape path for the gas in the space 155 is the small annular opening between the workpiece and the rim 142 of the chuck 132. As gas escapes from the space 155, it tends to prevent the workpiece 100 from touching the chuck 132, or any part of the rotor 92 or processor 50, except for the contact pins 154. The workpiece 100 is otherwise essentially suspended within a flow of gas. The guide pins 134 act, if needed, to prevent the workpiece 100 from moving too far off center of the spin axis of the rotor 92. Ordinarily though, the gas flow around the edges of the workpiece, and the normal force holding the workpiece against the contact pins 154, will tend to keep the workpiece centered.

The spin motor 84 is turned on, spinning the rotor 92 and the workpiece 100. In general, the gas flow vortex spins within the rotor in the same direction as the rotor spins. Process liquid is sprayed or jetted from the nozzles or inlets 112 onto the bottom or down facing surface of the spinning workpiece 100. Process gases or vapors may also be used. Centrifugal force helps to distribute the process liquids over the entire bottom surface of the workpiece 100. The gas flow in the rotor 92 also helps to prevent any process liquids or gases from contacting the top surface of the workpiece 100, as there is a constant flow of gas from the space above the workpiece to the space below the workpiece.

Following the application of process liquids and/or gases, the wafer may optionally be rinsed and/or dried, also while in the position shown in FIG. 4. When all processing within the processor 50 is completed, the workpiece 100 is unloaded following the reverse sequence of steps described above.

Interruption of the flow of gas to the rotor 92, while the rotor is holding a workpiece 100, could result in the workpiece 100 moving or falling out of the rotor 92. To reduce the potential for damage in this event, bowl stand off posts 110 are positioned in the bowl 78 and extend up to a position about 10-15 millimeters below the workpiece 100 (when in the processing position) as shown in FIG. 4. In the event of a gas flow interruption, the workpiece will drop only a short distance and come to rest on the stand-off posts 110.

After the gas moves out of the rotor 92, it is drawn into a gas exhaust plenum 120 and then removed from the processor 50. Depending on the specific processes to be run in the processor 50, the chuck 132 and drive plate 130 may optionally be made of corrosion resistant materials, such as PVDF plastic materials or equivalents. The rotor 92 as described above, and the entire head 80, may be used in virtually any centrifugal process where a process chemical, typically a liquid, is applied to one side only of a workpiece. While the processor 50 is shown in a vertical and upright position, it may also be used in other positions or orientations. Accordingly, the description here of top or bottom surfaces and up and down directions are provided to describe the examples shown in the drawings, and are not requirements or essential operating parameters.

In each of the embodiments described, the front or device side of the wafer may be facing towards or away from the rotor. For back side cleaning or processing, the wafer is placed into the rotor with device side facing the rotor. For front side cleaning or processing, the wafer is place into the rotor with the front side facing away from the rotor. The desired face up/face down orientation of the rotor may be achieved via robotic or manual handling. A separate inverting or wafer flipping station may also be used.

Generally, the gas provided to the rotor is inert, i.e., it does not significantly chemically react with the wafer. However, process chemical gases may be used in place of inert gases. Providing a process chemical gas to the rotor allows for chemically processing the side of the wafer facing the rotor, optionally while simultaneously processing the other side of the wafer with the same process chemical gas, or with a different process chemical gas or liquid.

As may be appreciated from the description above, the head 50 requires no moving parts for holding or securing the workpiece 100. Since gas flow is used to hold the workpiece in place, the head 80 may have a relatively simple design. In addition, generally, chemically compatible plastic materials may be used for most components. This reduces the need for metal components, which can lead to contamination. There are also no obstructions or components over or shadowing the workpiece 100. This allows distribution of process liquids onto the workpiece to be highly uniform, resulting in more consistent and uniform processing. The guide pins 134 only touch the edge of the workpiece. The contact pins 154 contact only very small areas of the front or top side of the workpiece 100. Consequently, touching the workpiece 100 is minimized.

Figure 9A:
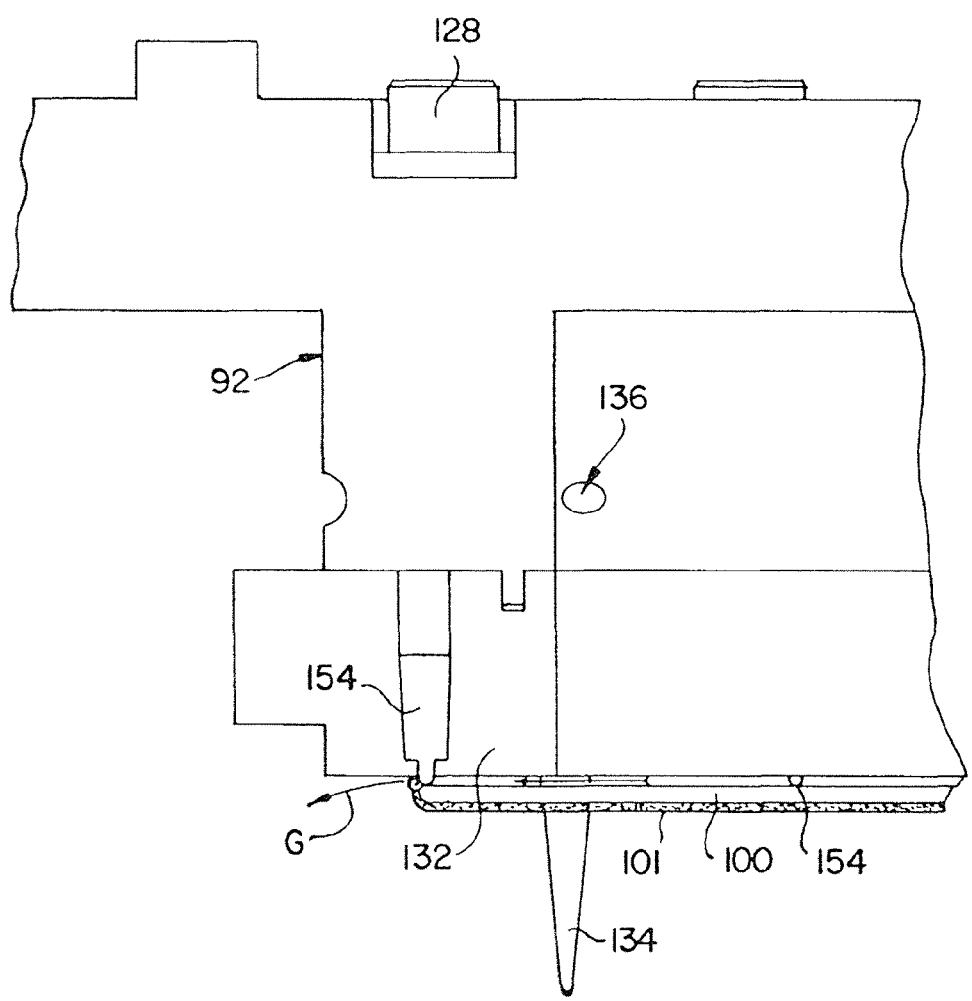
FIG. 9A is an enlarged section view of the edge of the rotor shown in FIGS. 7-9.

FIG. 9A is an enlarged view of the outer edge of the rotor 92 shown in FIG. 9. The gas provided into the rotor 92 flows outwardly out of the rotor, as indicated by arrow G. Process liquid 101 applied onto the bottom or down facing surface of the wafer 100 flows outwardly toward the edge of the wafer, as driven by centrifugal force. Depending on factors such as the spin speed, flow rate, and viscosity, the process liquid 101 may wrap around the edge of the wafer and move inwardly by a small distance (typically a few millimeters) on the top surface. The outward movement of the gas tends to reduce inward movement of the process liquid on the top surface, and may also result in a varying demarcation line (between the outer area on the top surface near the edge contacted by the process liquid, and the inner area that is not contacted by the process liquid). In some manufacturing processes, a uniform demarcation line is preferred.

Figure 9B:
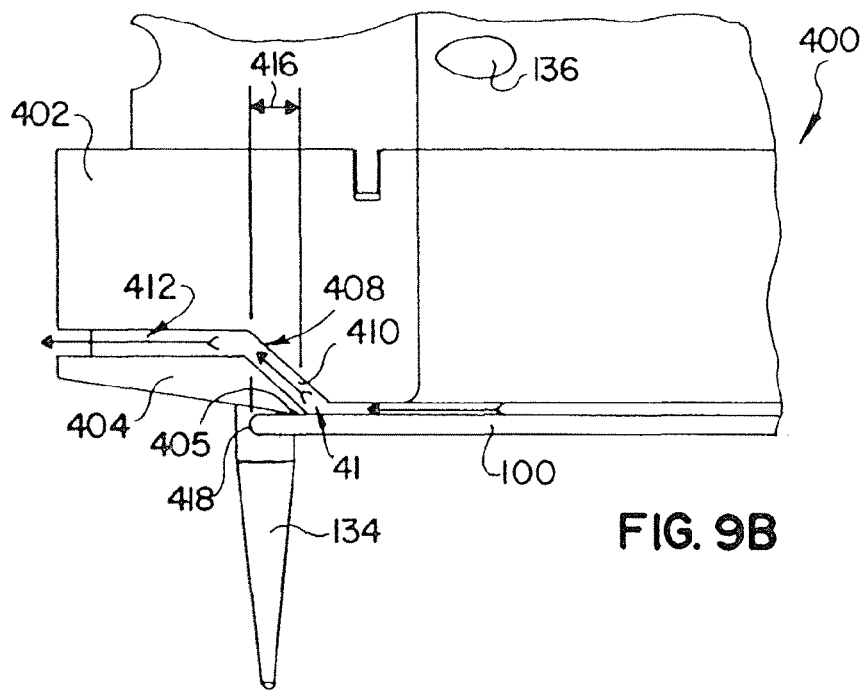
FIG. 9B is an enlarged section view of the edge of an alternative rotor.

FIG. 9B shows an alternative rotor design 400 that may be the same as the rotor 92, except as described here. The rotor 400 has an edge contact ring 404 attached to a rotor ring 402. The edge contact ring 404 may be a separate annular ring component that is attached, e.g., via fasteners, to the rotor ring 402, or it may be made as part of the rotor ring 402. A gas flow path, generally designated at 408 in FIG. 9B, is formed between the edge contact ring 404 and the rotor ring 402. The gas flow path 408 may be formed by an angled annular slot 410 cut into the rotor ring 402, and by gas outlet ports 412 connecting into the slot 410. The inlet 415 into the gas flow path 408 is at the lower inside opening of the slot 410.

Referring still to FIG. 9B, an inner edge 405 of the edge contact ring 404 contacts the edge of the wafer 100. In use, process liquid applied to the bottom surface of the wafer 100 moves outwardly and may wrap around the edge of the wafer 100, as shown in FIG. 9A. The inner edge 405 of the edge contact ring 404 acts as a seal or physical barrier to the process liquid on the top surface of the wafer. The inner edge 405 may be resilient and have a smooth bottom surface for sealing against the top surface of the wafer. The process liquid may contact the inner edge 405, but the process liquid cannot move past it. The gas supplied into the rotor 400 moves out of the rotor through the gas flow path 408. The pressure of the gas tends to prevent any of the process liquid from wicking between the inner edge 405 of the edge contact ring 404 and the wafer 100. As a result, processing with the rotor 400 results in a very uniform demarcation line. Referring to FIG. 9B, the rotor 400 allows process liquid to contact the upper surface only at an annular outer edge area 416. The width of the annular outer edge area 416 is set by the dimension from the inner edge 405 of the edge contact ring 404 and the edge 418 of the wafer 100, typically about 1 or 2 up to about 8 or 10 mm, and more typically about 2 or 3 mm.

Figure 9C:
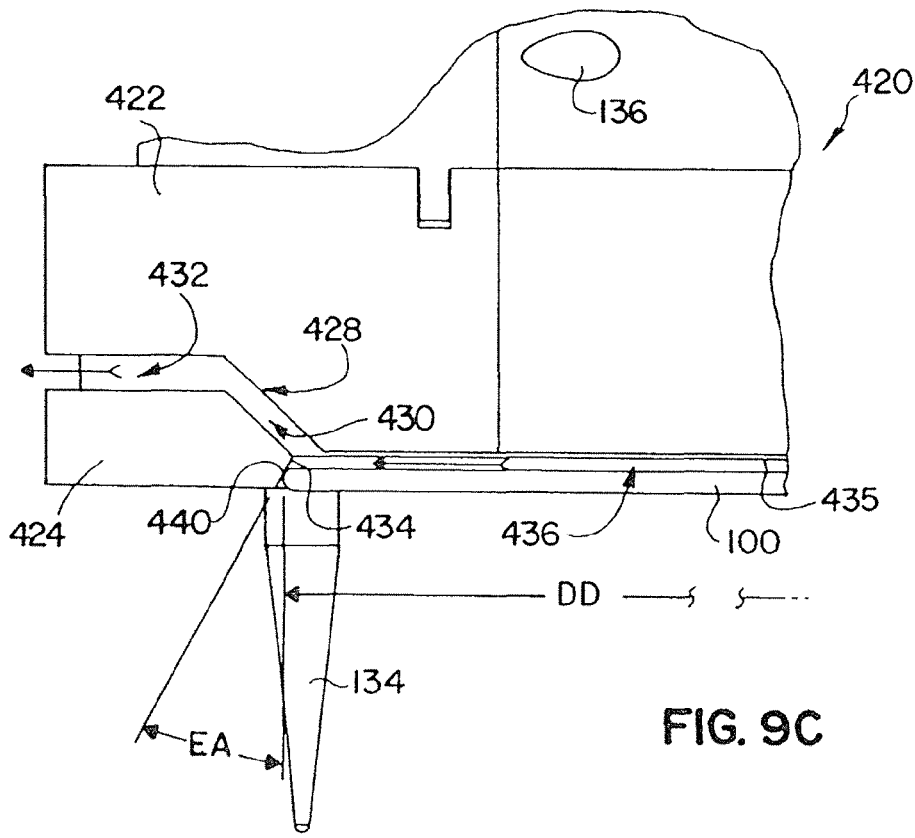
FIG. 9C is an enlarged section view of the edge of another alternative rotor.

FIG. 9C shows another rotor 420 which may also be the same as the rotor 92, except as described here. The rotor 420 has an edge ring contact 424 attached to a rotor ring 422. A gas flow path 428 is formed in the rotor 420, similar to the rotor 400. The gas flow path 428 may be formed by an annular slot 430 and gas outlet ports extending inwardly through the rotor ring and connecting into the slot 430. A wafer edge contact surface 434 on the edge ring contact 424 is oriented at an angle EA. The contact surface 434 and the bottom surface 435 of the rotor 420 in cross section form a recess 436 in the form of an isosceles trapezoid. The contact surface 434 forms the angled sidewalls which taper or extend conically outwardly from top to bottom. The angle EA of the contact surface 434 typically ranges from about 15 to 45°.

In use, the wafer 100 is held in the rotor 420 with the upper edge or bevel of the wafer in contact with the surface 434, as shown in FIG. 9C. This creates a line of contact 440 between the wafer 100 and the surface 434. Gas flows out of the rotor 420 through the gas flow path 428. Process liquid applied onto the bottom surface of the wafer may flow outwardly to the edge of the wafer, as shown in FIG. 9A. The process liquid can flow to and onto the edge of the wafer, but not onto the top surface of the wafer. The line of contact 440 acts as a seal or barrier preventing the process liquid from moving onto the top surface of the wafer 100. The pressure of the gas in the gas flow path 428 also tends to prevent any wicking of process liquid past the contact line 440. As a result, the demarcation line between the areas contacted by the process liquid and not contacted by the process liquid, is on the edge of the wafer 100. On wafers having a flat edge and upper and lower bevel surfaces, the contact line 440 (and the resulting demarcation line) is located on the upper bevel. On wafers having a radiused or rounded edge, the contact line 440 is located on the upper half of the rounded edge.

Referring still to FIG. 9C, the angle EA of the surface 434 may vary depending on the edge configuration of the wafers to be processed. The angle EA is advantageously selected to provide the contact line 440, rather a wider contact area. Hence, the surface 434 advantageously does not lie flat against a bevel surface of the wafer 100. Nominally, the diameter DD at the midpoint of the annular surface 434 is selected to match the diameter of the wafer to be processed, for example 200 or 300 mm. As wafer diameters tend to vary slightly due to manufacturing tolerances, any given wafer may be positioned slightly higher or lower on the surface 434. In FIGS. 9B and 9C, the arrows with the tails indicate the movement of gas through the rotor. The rotors shown in FIGS. 9A-D may be made primarily or entirely of a plastic material such as PVDF.

FIG. 9D shows another rotor 450 which is the same as the rotor 92 shown in FIG. 9 except that the rotor 450 further adapted for use with thin wafers. A standard silicon wafer is about 0.030 inches (0.75 mm) thick. However, thin wafers are now also used in many applications. These types of thin wafers are generally about 0.002 to 0.010 inches (0.05 to 0.25 mm) thick, and are typically 0.003, 0.004 or 0.007 inches (0.08, 0.10 or 0.18 mm) thick. As these thin wafers are more fragile than standard wafers, the machines and methods used for handling and processing standard wafers may not work well with thin wafers.

In FIG. 9D, the wafer 100 is supported near the edge on the contact pins 154, with the cylindrical or disk-shaped space or opening 155 above the wafer. As described above, since the velocity of the gas flow in the rotor is highest near the perimeter PP in FIG. 9D, the difference in pressure between the space above the wafer and the space below the wafer, is also highest near the perimeter PP. As a result, the normal force generated by the swirling gas and holding the wafer into the rotor is also highest near the perimeter PP. Since the contact pins 154 are located near the perimeter PP, the bending stress applied to the wafer by the normal force near the perimeter is low.

The velocity of the gas, and the normal force, decrease towards the center of the rotor. However, there is still usually some normal force acting near or around the center of the rotor. When processing wafers of standard thickness in the rotor 92 shown in FIG. 9, the stresses and deflection resulting from the normal force, away from the perimeter PP, are low enough to avoid damaging the wafer. However, processing thin wafers in the rotor 92 could result in excessive deflection (bowing upwardly) and cracking or other damage.

Referring to FIG. 9D, to counteract the tendency of a thin wafer to bow upwardly, the plug 146 is not used. This allows gas to flow down and out of the gas inlet line 86 and impinge directly onto the top surface of the wafer, at the center of the wafer. This flow of gas acts against the upward normal force. The up and down acting forces near the center of the wafer are consequently substantially balanced out. Upward bowing of a thin wafer is then reduced or avoided. The rotor 450 can accordingly handle thin wafers without damaging them. Referring still to FIG. 9D, one or more mechanical standoff pins 454 could alternatively be provided on the rotor to prevent excessive upward bowing of a thin wafer. However, use of gas flow to prevent the upward bowing achieves the same result, but without physically touching the wafer, thereby reducing the potential for causing contamination or defects.

As shown in FIG. 9D, a nozzle 452 may be provided at the bottom end of the gas inlet line 86. The nozzle may increase the velocity of the gas flowing out of the gas inlet line 86, resulting in a higher force acting downwardly at or near the center of the wafer. Additional similar gas outlets or nozzles may also be provided at other locations in the rotor, to exert downward forces on other areas of the wafer. The flow(s) of gas from the outlet(s) of nozzles 452 move downwardly, contact the top surface of the wafer, and then move outwardly toward the edge of the wafer 100, escaping from the rotor along with the gas from the gas inlets 136. The outward flow gas tends to prevent any liquids or vapors applied to the bottom surface of the wafer from moving around the edge of the wafer and onto the top surface of the wafer. Single side, or bottom side only, processing is therefore improved.

Figure 10:
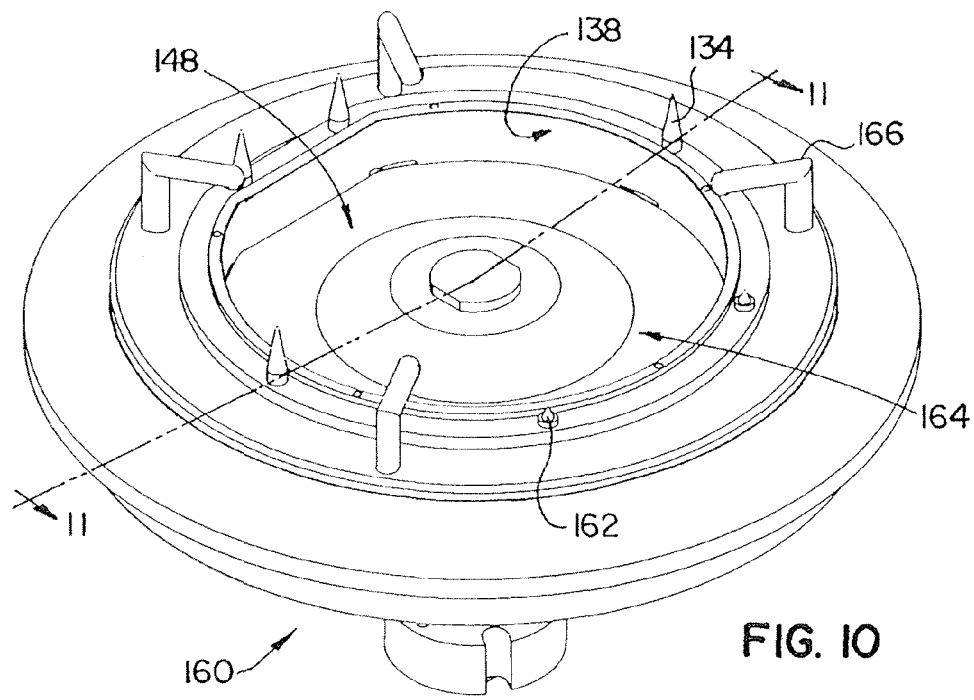
FIG. 10 is a bottom perspective view of an alternative rotor design.

FIGS. 10 and 11 show an alternative rotor 160. The rotor 160 is similar to the rotor 92, except for the differences described below. As shown in FIG. 10, on one side, the rotor 160 has short guide pins 162. The remaining guide pins 134 are full length guide pins, with the tip of the guide pin 134 extending by a dimension K beyond the rim 142 to the plane P. The full height guide pins 134 and workpiece holders 166 are spaced apart by dimensions greater than the diameter of the workpiece 100. L-shape workpiece holders 166 are attached to the drive plate 130 and have a horizontal leg extending radially inwardly. The short guide pins 162 create a entrance pathway 164, allowing a workpiece 100 to move laterally into the rotor 160 (in contrast to the vertical workpiece movement described above relative to the rotor shown in FIGS. 7-9. With lateral movement, the robot 44 can generally align the wafer 100 with the rotor 160, and then move down to place the workpiece 100 on the holders 166. The up-facing ends of each holder 166 preferably have a flat land area 168 for supporting the workpiece 100. The robot 44 can then withdraw to perform other functions within the system 30 even if the processor having the rotor 160 is not active. Accordingly, a workpiece 100 may be placed into the rotor 160 even when no gas is flowing through the rotor 160.

The rotor 160 shown in FIG. 11, in comparison to the rotor 92 shown in FIG. 9, is designed for handling smaller diameter workpieces. For example, the rotor 92 shown in FIG. 9 is designed for 300 mm diameter workpieces, while the rotor 160 shown in FIG. 11 is designed for 200 mm diameter workpieces. Of course, the rotor can be made in various other sizes as well for processing workpieces having other sizes.

Figure 11A:
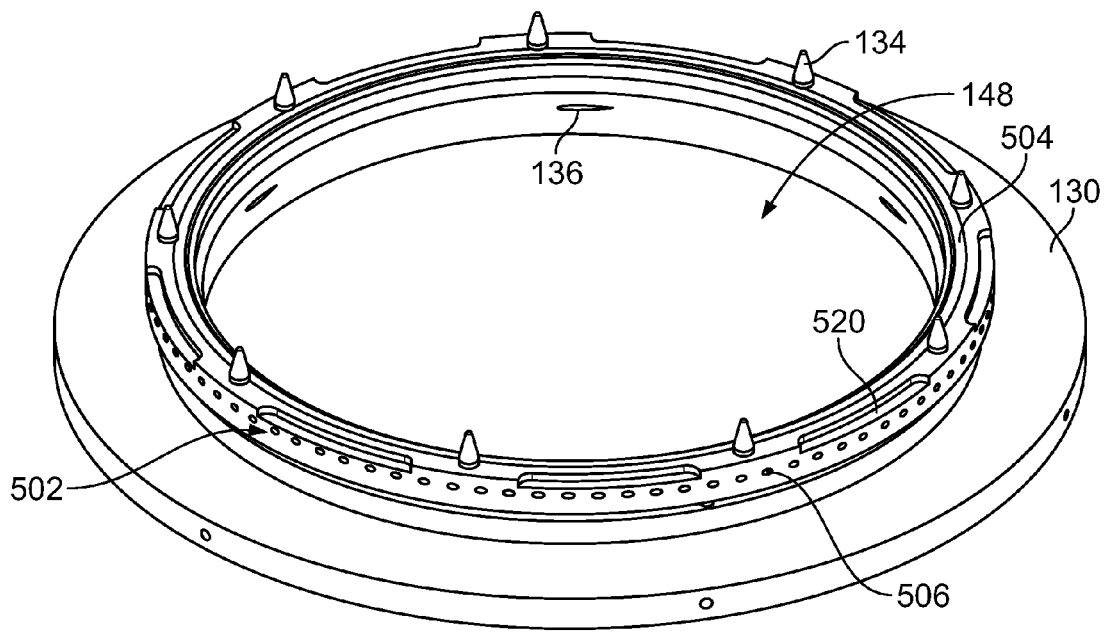
FIG. 11A is a bottom perspective view of another alternative rotor design.
Figure 11B:
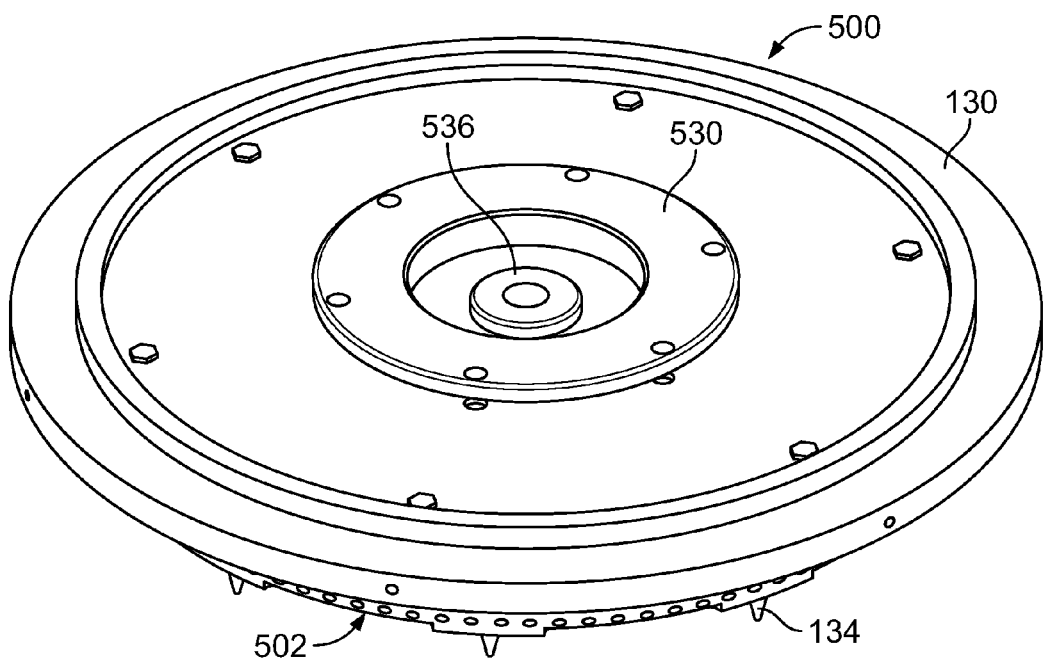
FIG. 11B is a top perspective view of the rotor shown in FIG. 11A.
Figure 11C:
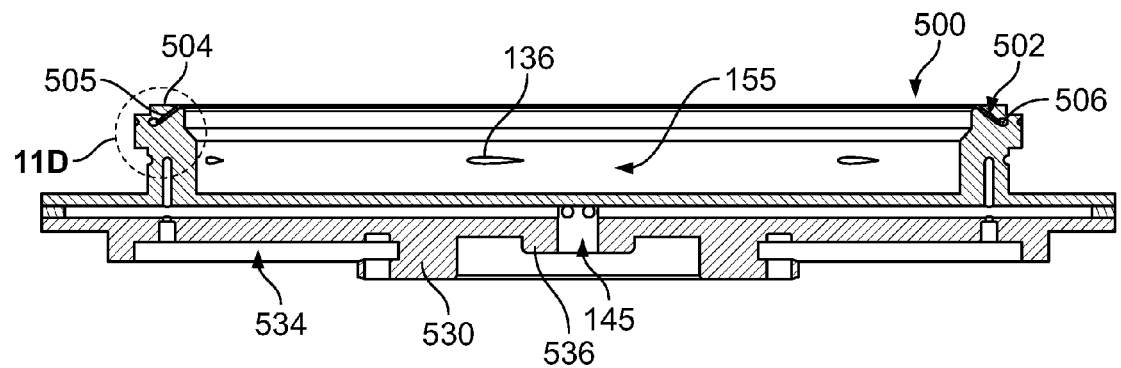
FIG. 11C is an inverted section view of the rotor shown in FIG. 11A.

FIGS. 11A-F show another rotor design which is generally similar to designs described above, and with the following additional or different features. Referring to FIGS. 11A, 11B and 11C, the rotor 500 has a hub 530 which may be integral with the drive plate 130. The rotor as shown in FIG. 11C may be made as a single piece from a plastic material, such as PVDF. The gas or air flow path 145 may be formed by drilling intersecting bores through the material, and then placing plugs or seals in the bores as needed. A gas or air inlet fitting 536 is centrally located on the top of the rotor 500, for connection to a gas or air source, as described above. A recess 534 may be provided around the outside of the hub 530, to accommodate a base or backing plate, such as the base plate 88 shown in FIG. 4. As shown in FIG. 11A, recesses 520 may be equally spaced apart around the circumference of the lower rim 502 of the rotor 500, between pins 134, to allow for improved robotic loading and unloading of a wafer into and out of the rotor 500. Specifically, the recesses 520 allow the robot to move in closer to the rotor 500.

Figure 11D:
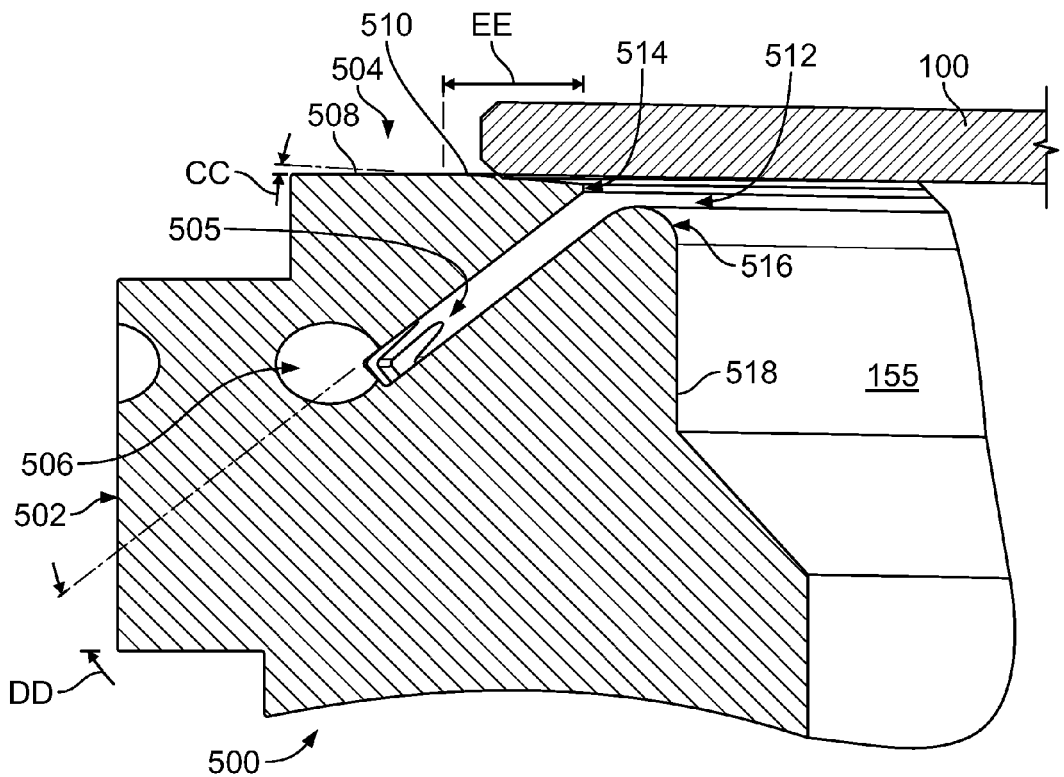
FIG. 11D is an enlarged detail of the lower rim of the rotor shown in FIG. 11A.
Figure 11E:
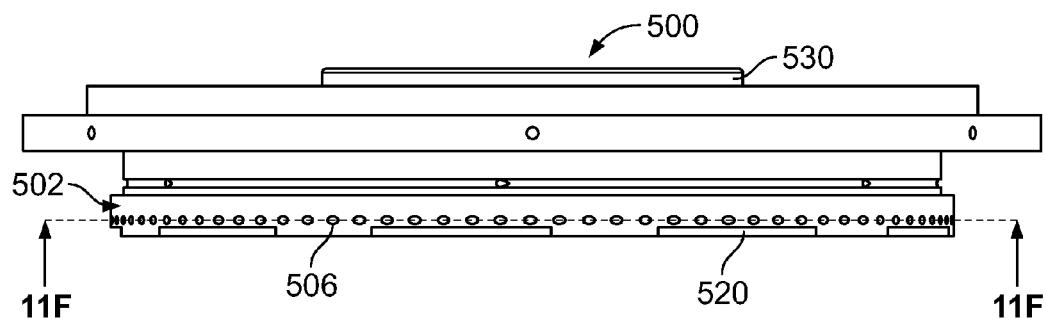
FIG. 11E is a side view of the rotor shown in FIG. 11A.

Referring now to FIGS. 11A, 11C and 11D, and with the understanding that these figures show the rotor inverted, a lower end 504 of the rotor 500 has an outer flat annular surface 508 surrounding an inner angled annular surface 510. The angled surface 510 may extend radially from the flat surface 508 by a dimension EE in FIG. 11D, to a location or radius 514. The angled surface 510 is oriented at an angle CC relative to the flat surface 508. The angle CC may vary from 1 or 2 degrees up to close to 90 degrees. Small angles, such as 1, 2, 3, 4, 5, 6, 7, 8, 9 or 10 degrees, may be useful to achieve movement of a process liquid onto the back side of the wafer, via capillary action. A slot 505 is provided in the lower rim 502 of the rotor 500, between the location 514 and an inner wall 518. With a wafer 100 in or on the rotor 500, an outflow space, generally designated as 512, connects the generally cylindrical or disk-shaped interior rotor space 155 within the rotor 500 with the slot 505. A radius 516 may be provided at the lower inside edge of the slot 505, where the inner wall of the slot joins the inner sidewall 518 of the rotor.

As shown in FIG. 11D, the slot 505 is oriented at an angle DD relative to the flat surface 508, or to horizontal. Angle DD may vary, and is typically about 20-60 or 30-50 degrees. The slot 505 will also typically extend continuously around within the lower rim 502, although in some designs, the slot may be segmented or interrupted. Angle DD is referred to here as a positive angle, as it is upwardly inclined moving radially outward. On the other hand, angle CC is referred to as a negative angle, as it is downwardly inclined moving radially outward.

Figure 11F:
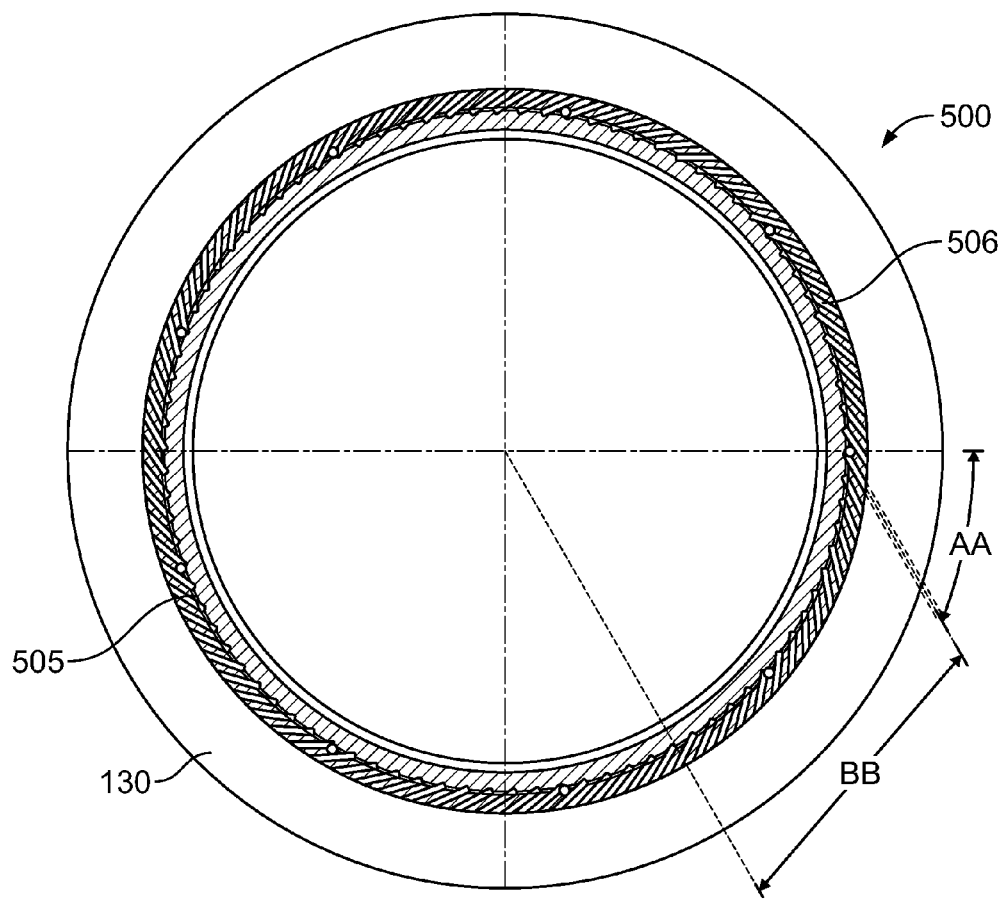
FIG. 11F is a section view taken along line 11F-11F of FIG. 11E.

Referring to FIGS. 11D and 11F, the gas or air outlet bores 506 are shown evenly spaced apart in the lower rim 502. The bores 506 are oriented at an angle AA relative to a diameter of the rotor, as shown in FIG. 11F. The angle AA is selected to allow the swirling gas or air within the space 155 to flow out without large changes in flow direction. As shown in FIG. 11F, the bores are oriented in a direction that is more tangent than perpendicular to the circumference of the lower rim 502. The angle AA accordingly is a leading angle (between 45 and 90 degrees) and may range from 50-85 degrees with typical values of about 55-65 degrees. Angle AA may be less than 45 or 50 degrees, although such designs may affect outflow of gas or air from the rotor.

To reduce resistance to the outflow of gas or air, a large number of bores 506 are used. In the design shown in FIG. 11F, for handling a 200 mm diameter wafer, 90 bores 506 are provided, equally spaced apart around the approximately 216 mm outside diameter of the lower rim 502. The bore diameter may vary depending on the rotor material and the structural strength needed for the rotor to handle the various forces applied during processing. In FIG. 11F, the bore diameter is about 0.2 mm. The bores 506 extend through the sidewall of the lower rim 502 to a depth sufficient to connect into the slot 505. Of course, depending on the bore diameter and other factors, the number of bores 506 may vary. For a 200 mm diameter wafer rotor 500 as shown, the number of bores used may be at least 40, 50, 60, 70, 80, 90, 100, 110, 120, or more. A rotor designed for larger wafers, for example 300 mm diameter wafers, more bores will typically be used, for example, at least 130, 140, 150, 160, 170, 180, 190, 200 or more. The flow characteristics of the rotor are also affected by dimensions of the slot 505 and the outflow space 512. However, ordinarily, these are continuous annular openings allowing for less restricted flow in comparison to the bores 506. Accordingly, the width of the slot 505 and the outflow space 512 may be about 70, 60, 50, 40, or 30%, or less of the diameter of the bores 506.

In use, the rotor 500 may be included in systems and apparatus as described above, and the rotor 500 operates in the same way as with the other rotor designs described above, with the following differences. Referring to FIG. 11D, a wafer 100 is placed into the rotor 500, with the outer edge of the wafer resting on lower end 504 of the rotor. The pins 134 tend to center the wafer 100 on or in the rotor. For a 200 mm wafer as shown, the width EE of the angled surface 510 is about 3 mm. The angled surface 510 extends from the inner location or radius 514, which is on a diameter of about 195 mm, to the a diameter of about 202 mm, where the angled surface 510 meets the flat surface 508. As a result, the outer edge of the wafer rests on the angled surface 510.

Gas or air flows from the outlets 136 and moves around in a circular pattern in the space 155, as described above. In the rotor shown in FIG. 11F, the flow is clockwise. However, in other versions of the rotor, the flow may be counter-clockwise. Referring to FIG. 11D, the with gas or air moving around with the space 155, a fraction of the flow moves through the outflow space 512, into the slot 505, and then out of the rotor through the bores 506. The rotor itself may be rotating clockwise or counter clockwise while the gas or air flow is used to hold the wafer onto the rotor. For process steps, however, the gas or air may be flowing through the rotor, while the rotor is stationery. Typically the gas flow and rotor rotation are in the same direction, i.e. clockwise in FIG. 11F. The outflow space 512, slot 505 and bores 506 provide a low resistance flow path for the gas or air flowing out of the rotor, while also providing a rotor having sufficient strength and stiffness. These features also provide for a highly uniform gas flow through the rotor, which may contribute to more uniform processing.

One or more process liquids are applied to the front (downfacing as in FIG. 1 or 4) side of the wafer. With the rotor 500 spinning, the process liquid is distributed across the front side of the wafer, via centrifugal force. Depending on the process liquid and other process parameters, process liquid may also flow up and around the edge of the wafer 100, to the location where the wafer 100 contacts the angled surface 510. Some of the process liquid may then move inwardly between the back side of the wafer and the angled surface 510, via capillary action, up to the radius 514. Due to the flow of gas or air moving through the outflow space 512, and the lack of any capillary action inward of the radius 514, virtually no process liquid, vapor or gas can move radially inwardly on the back side of the wafer past the slot 505. Consequently, the rotor 500 allows for processing the front or first side of the wafer, the edge, and an outer annular area of the back or second side of the wafer.

The amount of process liquid egress on the back side of the wafer may be determined in part by the angle CC. The greater the angle CC, the less process liquid will move radially inwardly on the back side of the wafer, since capillary action decreases with greater or steeper angles. The angle CC may also be set up as a negative angle. In this case, the wafer 100 then rests on an annular sharp edge, radius, or plateau, with a wedge-shaped annular gap formed between the angled surface 510 and the back side of the wafer.

Figure 11G:
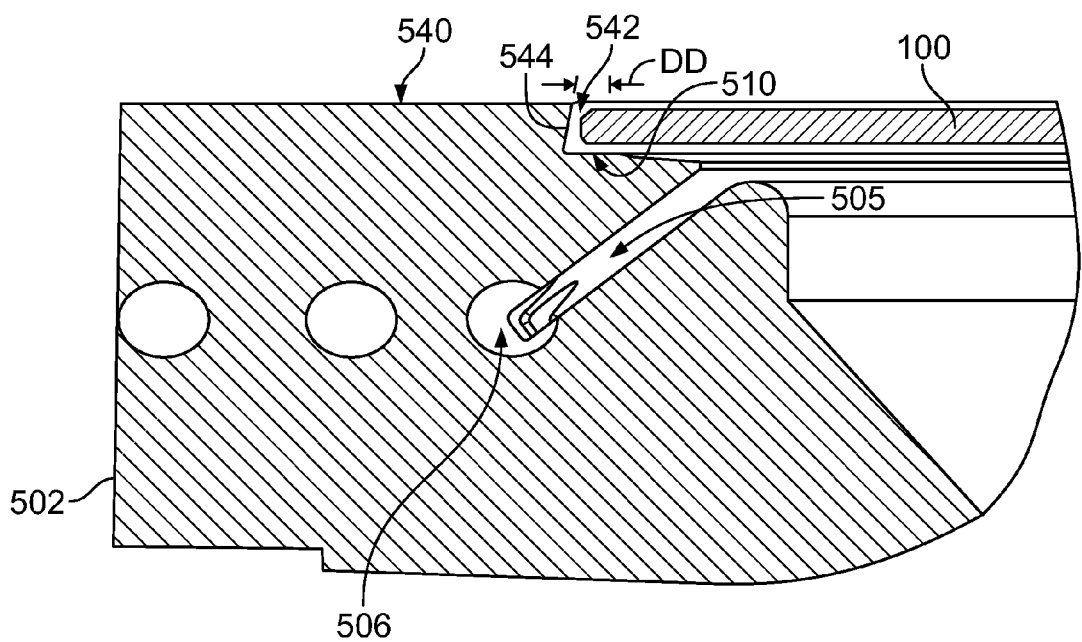
FIG. 11G is an enlarged detail of the lower rim of an alternative rotor design.

FIG. 11G shows an alternative rotor design 540 having a counter bore 542 in the lower rim 502. The top surface of the counter bore may be formed as an angled surface, oriented at angle CC. The cylindrical sidewall 544 of the counter bore 542 may be inclined inwardly at an angle DD, from top to bottom, again with the understanding that FIG. 11G shows the rotor upside down. Angle DD may range from about 1-20°. The diameter of the counter bore 542 is slightly larger than the diameter of the wafer 100, so that the wafer rests in the counter bore. As liquid is applied to the exposed down facing first side of the spinning wafer 100, the liquid moves out and around the edge of the wafer, and into the counter bore 542. As a result, in addition to contacting the first side, the liquid also contacts and processes the edge, and the outer annular area of the second side (extending from the edge inwardly to the slot 505).

Figure 11H:
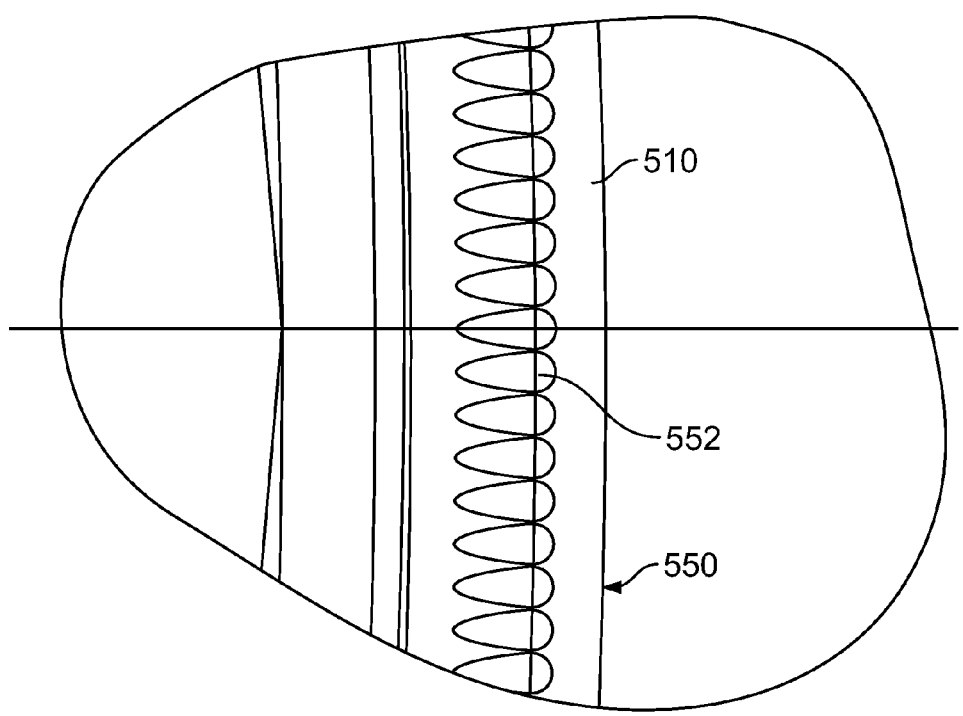
FIG. 11H is a top view of the angled surface of another alternative rotor design.

FIG. 11H shows an alternative rotor design 550, which is the same as the rotor 500, except that recesses 552 are provided on the angled surface 510. The recesses allow more liquid to flow between the second side of the wafer and the rotor. The recesses 552 may take various forms, including grooves, gaps, etc. The recesses 552 shown in FIG. 11H are substantially continuous, with each recess contacting adjacent recesses, around the diameter of the angled surface 510. However, the recesses may also be interrupted or discontinuous.

The angled surface 510 may be used alone in rotor designs, or in combination with the outflow space, slot and bores flow pathway designs, as shown in FIG. 11D. Alternatively, any of these elements may also be used in combination with the other rotors described above.

Figure 12:
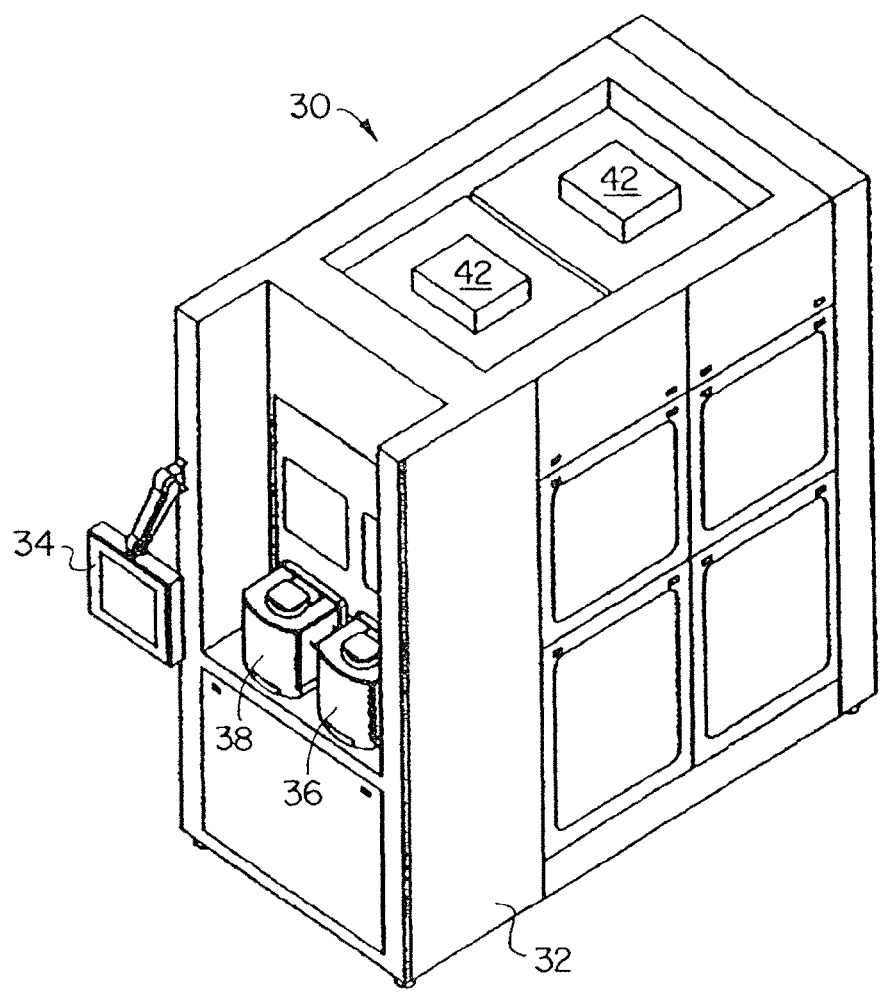
FIG. 12 is a perspective view of a workpiece processing system including several of the processors as shown in FIGS. 2-9.

The processors described above may be used in automated processing systems. An example of one processing system 30 is shown in FIG. 12. The processing system 30 generally has an enclosure 32, a control/display 34, and an input/output or docking station 36. Wafers or workpieces within pods or boxes 38 (e.g., FOUPs) are removed from the boxes 38 at the input/output station 36 and processed within the system 30.

Figure 13:
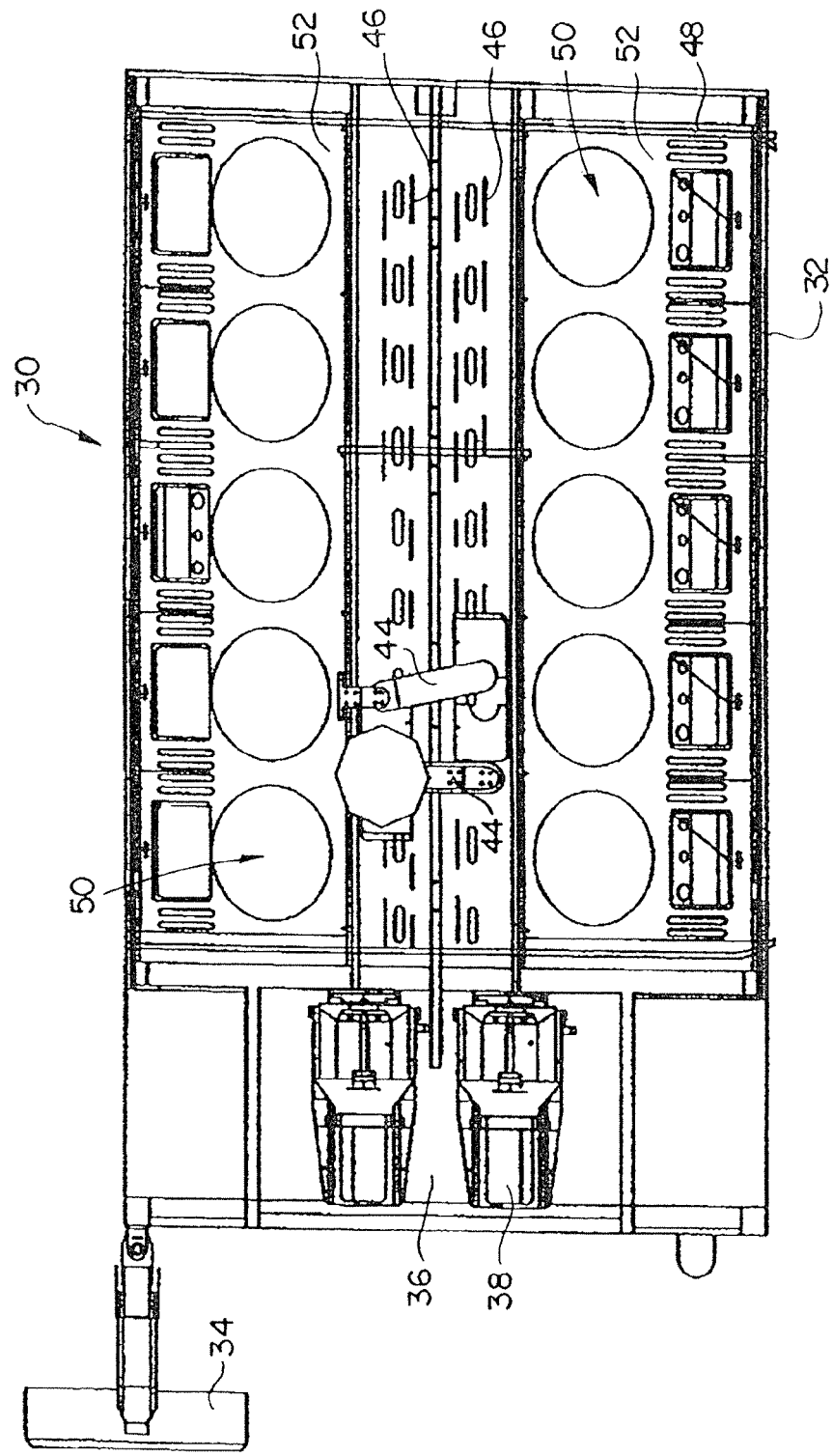
FIG. 13 is a plan view of the system shown in FIG. 12.

Turning to FIG. 13, the processing system 30 preferably includes a frame 48 that supports an array of workpiece processors 50 on a deck 52 within the enclosure 32. Facility air inlets 42 are typically provided along with air filters, at the top of the system 30. Each workpiece processor 50 may be configured to process workpieces, such as 200 or 300 mm diameter semiconductor wafers or similar workpieces, which may be provided within sealed boxes 38, open cassettes, or other carriers or containers.

The frame 48 in FIG. 13 is shown supporting ten workpiece processors 50, but any desired number of processors 50 may be included. The frame 42 preferably includes one or more centrally located rails 46 between the processors 50. One or more robots 44 can move on the rails 46 to load and unload workpieces into and out of the processors 50.

Figure 14:
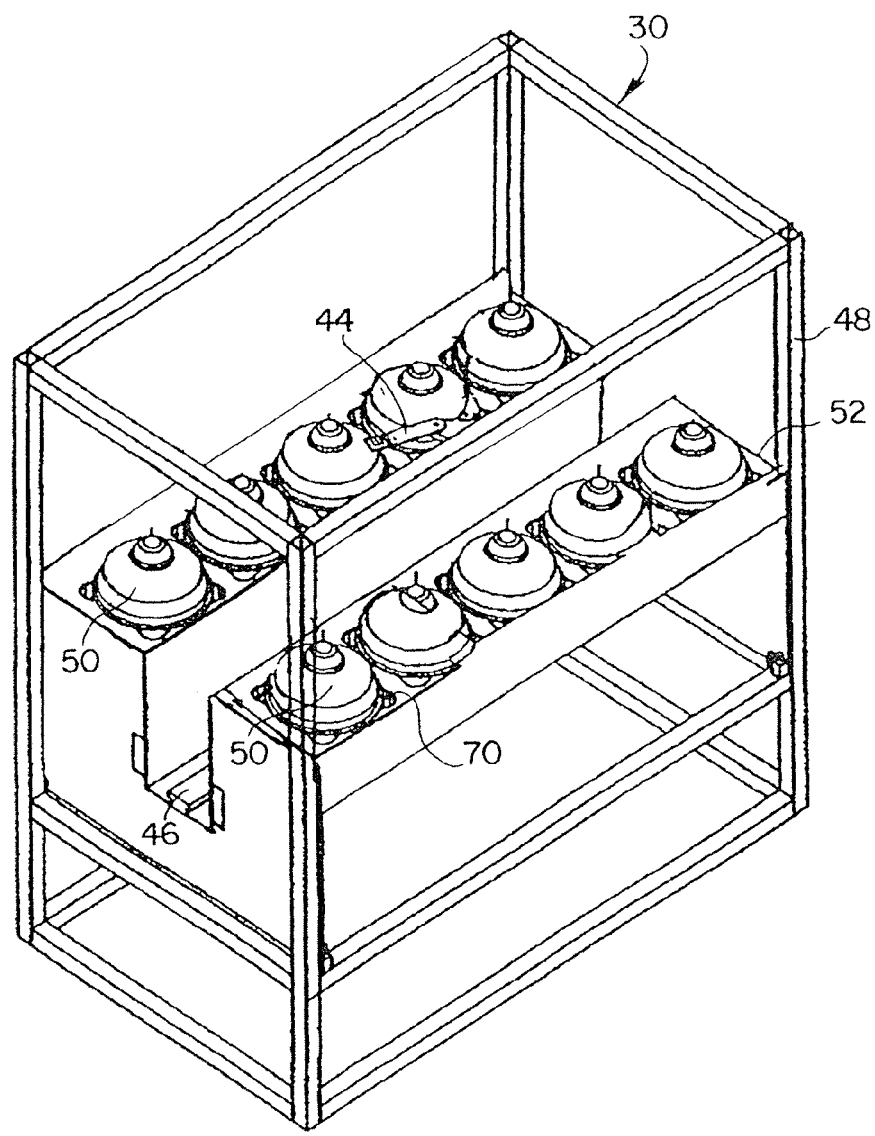
FIG. 14 is a perspective view of components or subsystems shown in FIG. 12.

Referring to FIGS. 12-14, in use, workpieces or wafers 100 are typically moved to the processing system 30 within containers 38 such as front opening unified pods (FOUPs) or similar closeable or sealable containers. Alternatively, open containers such as cassettes or other carriers may also be used. At the docking or input/output station 36, the door or cover of the container 38, if any, is removed, generally via a robotic or automated subsystem. The load port door or window in the enclosure 32, if any, is opened. The robot 44 removes a workpiece 100 from a container 38 and carries it to one of the processors 20 or 50. The workpiece 100 is then ready for loading into a processor. This sequence of steps, as well as the components or apparatus used in moving the workpiece 100 to the processor may of course vary, and are not essential to the invention. Rather, the sequence described above and as shown in FIGS. 12-14 represents an example, for purposes of explanation.

Figure 15:
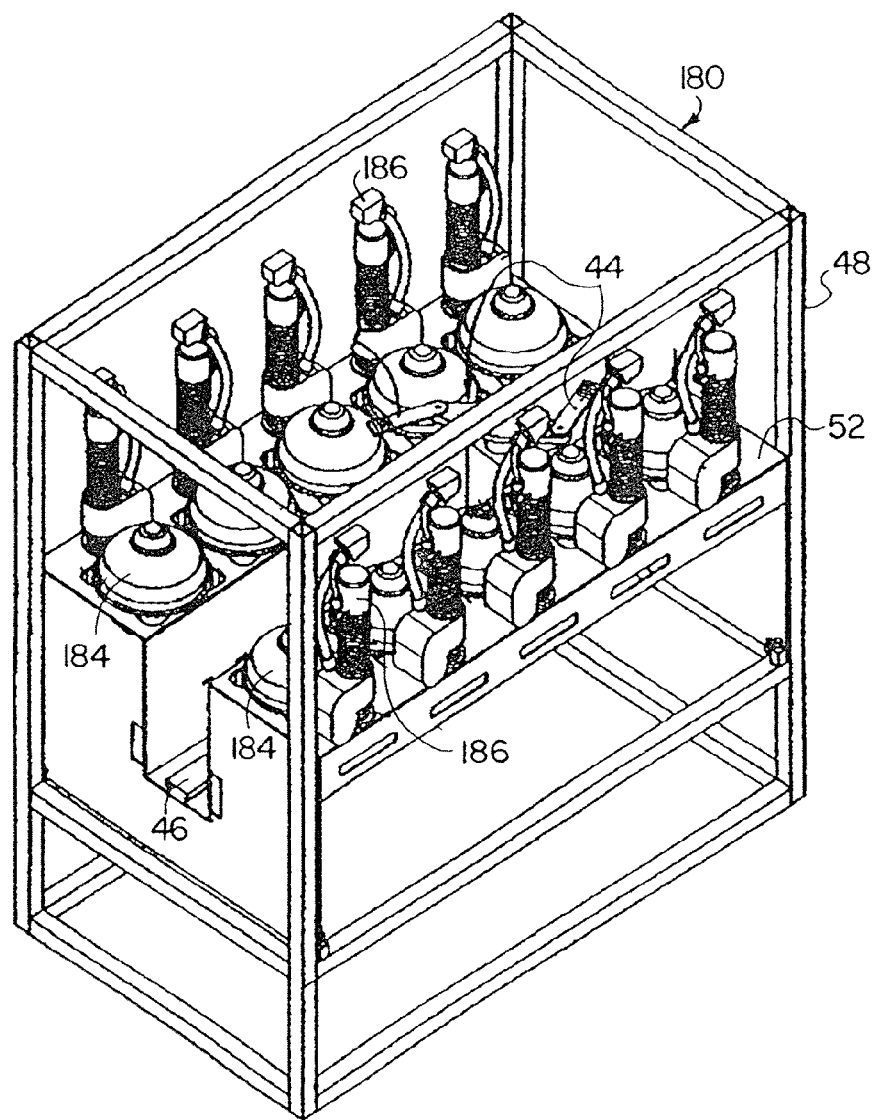
FIG. 15 is a perspective view of selected components and subsystems of an alternative processing system.
Figure 16:
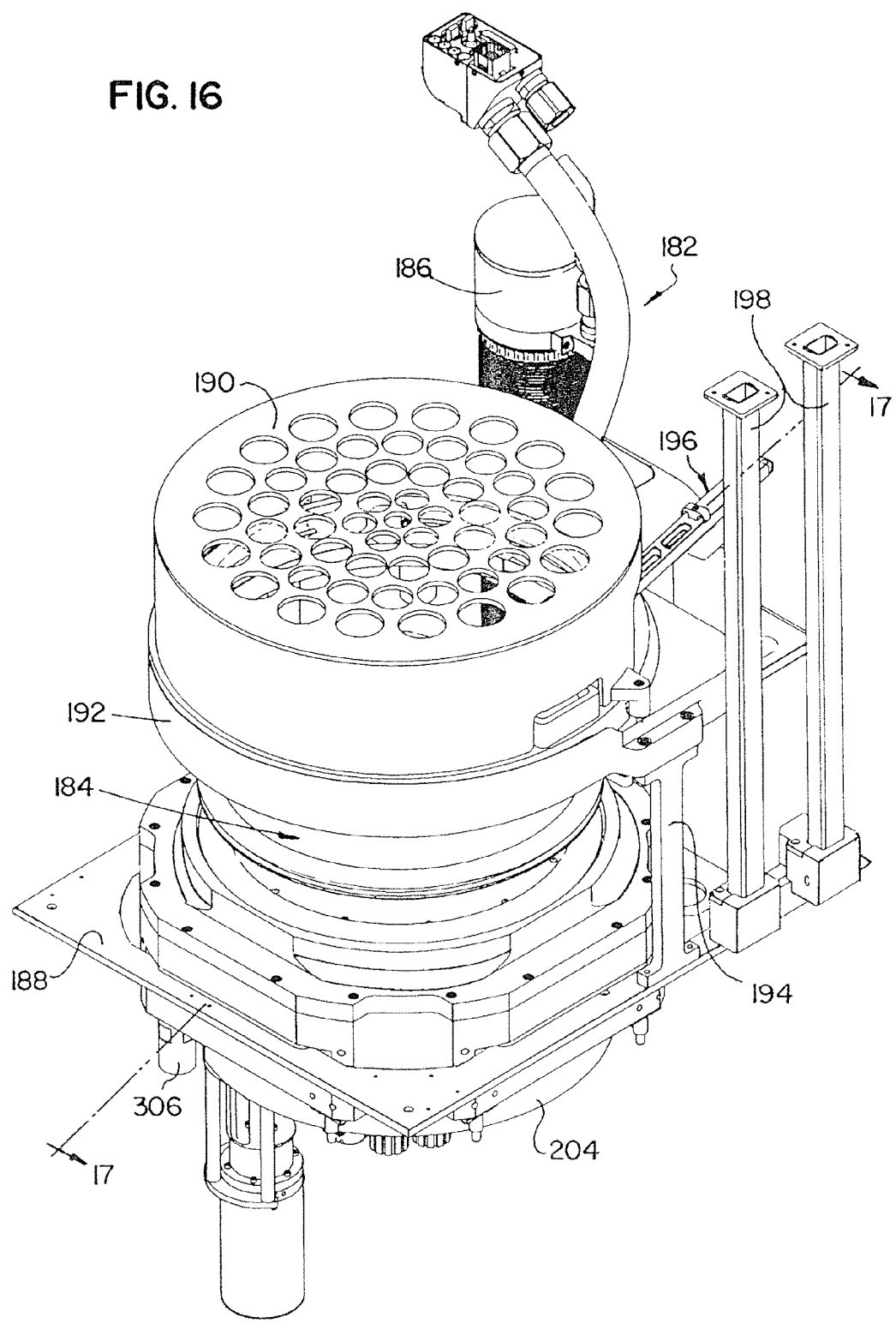
FIG. 16 is a perspective view of one of the processing assemblies shown in FIG. 15.
Figure 17:
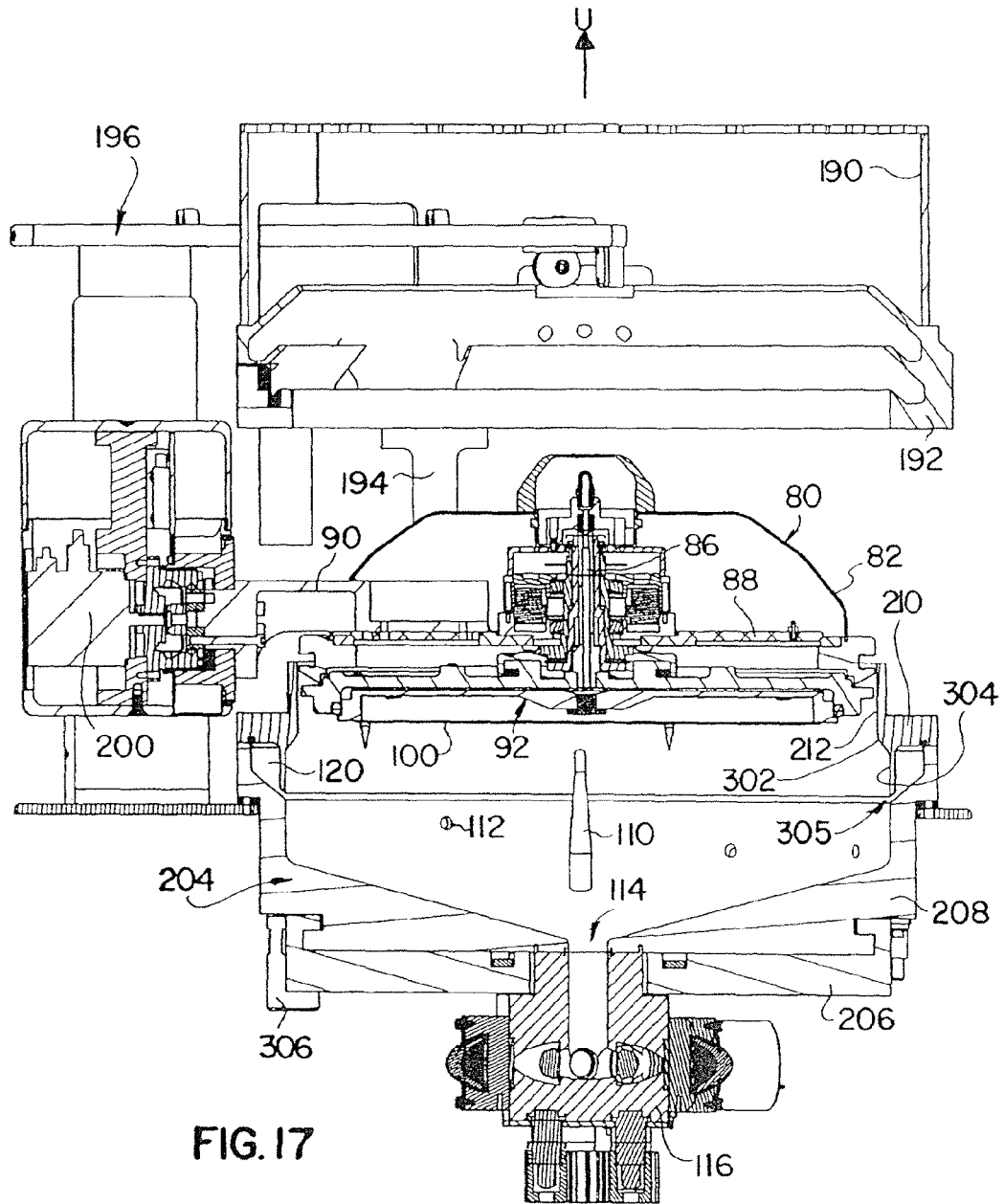
FIG. 17 is a section view taken along line 17-17 of FIG. 16.

Referring momentarily to FIG. 5. flow sensors in the head 80 may be used to verify the flow of gas, indicating to the controller 34 that the robot 44 may be safely withdrawn. The robot 44 moves down and away from the rotor 92. Sensors on the robot 44 verify that the workpiece 100 is no longer on the robot 44. The robot then retracts away from the processor 50. The processor then operates as described above FIGS. 15-18 show an additional alternative system 180. The components and operation discussed above with reference to FIG. 12 apply as well to the system 180 shown in FIG. 15. The system 180 shown in FIG. 15 is similar to the system 30 shown in FIGS. 12-14. However, processor assemblies 182 are installed on the deck 52 within the enclosure 32, instead of the processors 50. As shown in FIGS. 16 and 17, one or more of the processor assemblies 182 includes a processor 184 which may be attached to a mounting plate 188, and a lift/rotate unit 186. The lift rotate unit 186 is attached to the head 80 through the head lifting arm 90, in place of the head lifter used in the system 30 shown in FIGS. 12-14. In addition to lifting the head 80 vertically up and away from the bowl 78, the lift/rotate unit 186 can also flip or rotate the head 80 into an upside down position.

As shown in FIG. 16, an air shield 190 is positioned on top of a rim 192 supported above the processor 184 on rim posts 194. Electrical wiring runs through cable guides 198 which generally extend from near the top of the enclosure 32 to the mounting plate 188. Referring to FIGS. 16 and 17, a drying process swing arm 196 is supported on and driven by a swing arm actuator 200 on the mounting plate 188, and to one side of the processor 184.

The head 80 shown in FIG. 17 is similar or the same as the head 80 shown in FIGS. 2-9 and described above. The head 80 shown in FIG. 17 is engageable with a bowl 204. The bowl 204 advantageously has a top section 210 having a cylindrical upper end 212, a center section 208, and a bottom plate 206. The bowl 204 also has a reciprocating spray swing arm 220 driven by a actuator 222. One or more spray or jet nozzles or inlets 218 are provided on the swing arm 220. The bowl 204 is otherwise similar to the bowl 78 described above. The process chemicals applied by the nozzles or inlets in the bowl 78 or 204 may be liquid acid solutions, such as HF, HCL, nitric acid, or sulfuric acid. Alternatively, the process chemicals may include liquid solvents. The lift rotate unit 186 may position the head 80 at various vertical positions relative to the base.

Referring to FIGS. 4 and 17, the processor assemblies 50 and 182 are shown in an upright orientation, with the arrow U pointing vertically up (i.e., opposite to the direction of gravity). The arrow U is also shown as co-axial with the rotor spin axis. A joggle or angle section 302 extends between the cylindrical upper end 212 of the top section 210 of the bowl 204, and a cylindrical lower shield 304. The cylindrical upper end 212 and the cylindrical lower shield 304 may be generally vertical or near vertical surfaces. The angle section 302 connecting them is oriented at an angle of about 20-70° or 30-60° or 40-50° degrees from vertical. The lower end of the angle section 302 (where the angle section 302 joins the lower shield 304) is generally near or at the same vertical position as the top of the exhaust plenum 120. The lower end of the lower shield 304 is spaced slightly apart from angle section 304, providing an annular gas flow passageway 305.

With the edge of the spinning wafer generally aligned vertically with the angle section 302, liquid flung off the wafer 100 tends to be deflected downwardly, towards the bottom of the bowl 204. This reduces back splattering onto the wafer. The annular lip exhaust channel or plenum 120 is positioned around the lower shield 304. Gas exhaust pipe connections 306, generally located on opposite sides of the bowl, lead into the exhaust channel 120. A slight vacuum may be applied to the pipe connections, inducing gas flow from the bowl, through the passageway 305 to the exhaust channel 120 and then out of the processor via the pipe connections 306. Typical gas flow through the processor ranges from about 60-200, 100-170 or 120-150 liters per minute.

The head 80 of the processor 184 operates in the same way as the head 80 described above relative to FIGS. 2-9. The nozzles or inlets 218 on the swing arm 220 apply process liquids onto the bottom surface of a workpiece 100. Fixed nozzles or inlets may also be used, with or without the swing arm nozzles. When this processing is complete, the lift/rotate unit 186 lifts the head 80 up and rotates the head into an up-facing position, i.e., the down facing surface of the wafer in the processing position shown in FIG. 17, is moved into an up-facing position.

While the rotor 92 is rotating, the drying process swing arm 196 applies drying fluids onto the workpiece 100. The drying process swing arm 196 begins at or near the center of the workpiece and moves radially outwardly towards the edge of the workpiece, to dry the workpiece as described in U.S. patent application Ser. No. 11/075,099, incorporated herein by reference. The openings in the shield 190 help to diffuse and/or control downward air flow through the processor assembly 182.

Figure 18:
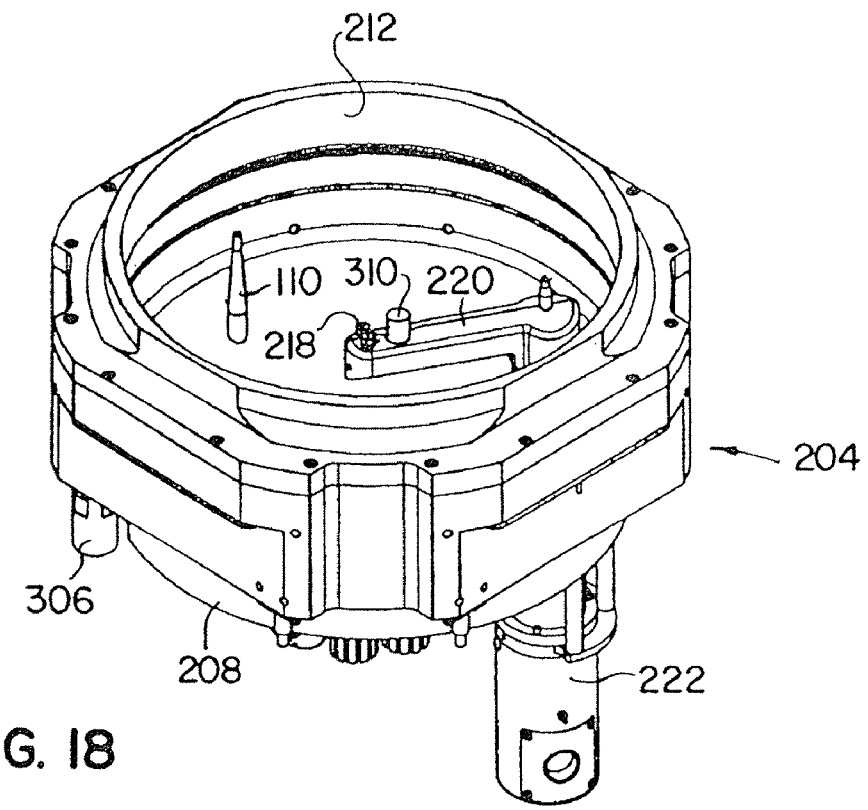
FIG. 18 is a perspective view of the bowl shown in FIGS. 16 and 17.

Referring to FIG. 18, an optical end point detector 310 may be provided on the swing arm 220. The end point detector may use elements or steps as described in U.S. patent application Ser. No. 11/288,770, incorporated herein by reference. The controller may include software to integrate the signal provided from the moving end point detector 310. This may shorten the process time and improve yield by reducing over etching.

The drying process swing arm 196 typically applies de-ionized water (DI) along with nitrogen and a solvent, such as isopropyl alcohol vapor, as the arm sweeps across the up-facing surface of the workpiece. A similar process could alternatively be performed by the swing arm 220 in the bowl 204. Other process liquids or gases including ozone gas, or ozone dissolved and/or entrained in a liquid, such as Di, may also be applied via fixed or moving nozzles or inlets in the bowl 78 or 204.

While the head is inverted or up-facing, gas flow through the rotor 92 continues, thereby holding the workpiece 100 against the contact pins 154. Similarly, the workpiece 100 is held onto the rotor 92 while the head 80 pivots from the down-facing position shown in FIG. 17 to the up-facing position by the normal force holding the workpiece against the contact pins 154.

Figure 19:
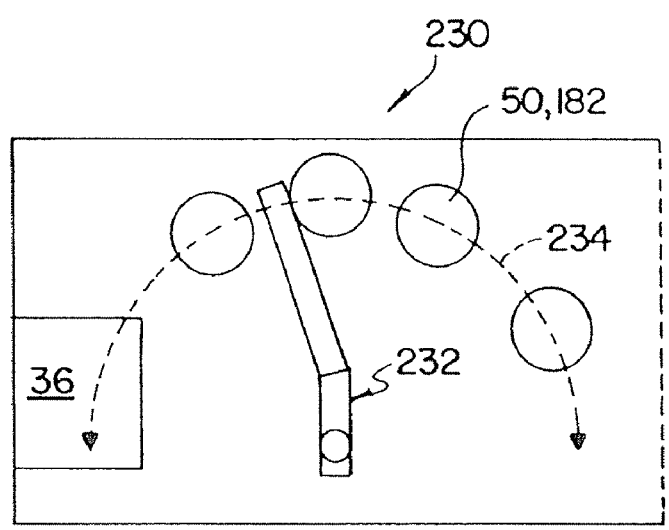
FIG. 19 is a schematic diagram of an alternative processing system.

FIG. 19 shows an alternative system design 230 having processors or processor assemblies 50 or 182 arranged in an arc 234, or other array or pattern, rather than the linear columns shown in FIGS. 12 and 15. Workpieces 100 may be moved into and out of the processors 50 or 182 by a single robot 232. While automated or robotic systems 30 and 180 have been shown and described, the head 80 and rotors 92 and 160 may be used in various other systems including manually operated and/or single processor machines.

The terms cylindrical, round, or circular also include multi-segmented shapes. The term engaged or engagement includes actual physical contact, as well as adjacent positioning allowing cooperation between the elements without physical contact between them. The term vortex or gas flow vortex means a flow of gas having a generally circular characteristic, and includes helical, spiral, and similar flows. The term gas includes elemental gases, such as nitrogen, oxygen, ozone, carbon dioxide, and other gases used in semiconductor manufacturing, as well as mixtures of them, air, and vapors. The plural, as used here, includes the singular as well, and vice-versa. The terms attached to or supported on include both direct and indirect connections or interactions. The terms up and down, and top and bottom, may be used interchangeably, except when it is clear from the context that either direction or position is essential. Novel systems and methods have been shown and described. Various changes, substitutions and uses of equivalents may of course be made, without departing from the spirit and scope of the invention. The invention, therefore, should not be limited, except by the following claims and their equivalents.

The invention claimed is:

1. A workpiece processor comprising:
a bowl having one or more process fluid inlets;
a head which may be engaged with the bowl during workpiece processing;
a rotor supported on the head and rotatable relative to the head, with the rotor adapted to hold a workpiece having a diameter D at a workpiece position and with the rotor having an outer annular sidewall around the workpiece position;
a pressurized gas supply connected to a gas inlet line on the rotor;
a plurality of gas inlets in the annular sidewall of the rotor, with the gas inlet line connecting to the gas inlets;
an annular slot extending around the rotor, and concentric with a rotation axis of the rotor, and with the annular slot having a diameter less than D;
a plurality of bores extending into the rotor and connecting into the annular slot; and
wherein the pressurized gas supply and the gas inlets are configured to spray gas into a space above the workpiece position to hold a workpiece in the workpiece position using only gas pressure forces.

2. The workpiece processor of claim 1 with the slot extending upwardly and radially outwardly from the sidewall of the rotor.

3. The workpiece processor of claim 1 with substantially each of the bores forming an angle AA with a diameter of the rotor extending through the bore, and with angle AA ranging from about 50-75 degrees.

4. The workpiece processor of claim 1 with the rotor having at least 40 bores substantially equally spaced apart around a lower rim of the rotor.

5. The vvorkpiece processor of claim 1 further comprising a plurality of spaced apart wafer locating pins on the outer annular surface.

6. The workpiece processor of claim 1 with the inner annular surface extending at an upward angle towards a central axis of the rotor.

7. The workpiece processor of claim 1 with the rotational gas flow system further including an annular outflow space leading from cylindrical space within the rotor to the slot.

8. A processor for processing a workpiece having a workpiece diameter, comprising:
a bowl having one or more process fluid nozzles;
a head associated with the bowl;
a rotor in the head;
a motor in the head linked to the rotor, for rotating the rotor;
an interior space in the rotor surrounded by an annular sidewall of the rotor, with the annular sidewall having a diameter greater than the workpiece diameter;
a plurality of gas openings in the annular sidewall and positioned at least partially tangent to the annular sidewall sidewalls;
an annular slot extending radially outwardly and upwardly from the interior space of the rotor;
a plurality of bores leading from the annular slot to an outer surface of the rotor, and with substantially each bore oriented on an axis forming an acute angle with a radius of the rotor; and
wherein the plurality of gas openings in the annular sidewall are positoned to project a pressurized gas into the interior space of the rotor, to create a circular flow of gas in the interior space within the rotor to hold a workpiece in the workpiece position using only gas pressure forces.

9. The processor of claim 8 wherein the acute angle is a leading angle relative to a rotation direction of the rotor.

10. The processor of claim 8 further comprising a counter bore in the lower end of the rotor, with the counter bore having an upper annular surface extending radially outward from the slot.

11. The processor of claim 10 with the upper annular surface oriented at a non-perpendicular angle to an axis of rotation of the rotor.

12. A workpiece processor comprising:
a bowl having one or more process fluid nozzles;
a head supported on a head lifter for moving the head into and out of engagement with the bowl;
a rotor supported on the head and rotatable relative to the head, with the rotor having a lower annular end, and the rotor adapted to hold a workpiece at a workpiece position above the lower annular end of the rotor;
a pressurized gas supply connected to a gas inlet line on the rotor; a plurality of gas nozzles in the rotor, with the gas nozzles located on one or more diameters surrounding the workpiece position and with the gas inlet line connecting to the gas nozzles;
an annular slot extending around the rotor concentric with a rotation axis of the rotor, with the annular slot intersecting the lower annular end of the rotor at an acute angle;
a plurality of bores extending into the rotor and connecting into the annular slot; and
wherein the gas nozzles between the lower annular end of the rotor and the workpiece position, and with the pressurixed gas supply and the gas nozzles configured to hold a workpiece in place in the workpiece position with no element of the rotor contacting a down-facing side of a workpiece in the rotor.

\* \* \* \* \*